(12) United States Patent
Cho et al.

(10) Patent No.: US 11,508,419 B2
(45) Date of Patent: *Nov. 22, 2022

(54) PAGE BUFFER AND MEMORY DEVICE INCLUDING THE SAME

(71) Applicant: SAMSUNG ELECTRONICS CO., LTD., Suwon-si (KR)

(72) Inventors: Yong Sung Cho, Hwaseong-si (KR); Jeung Hwan Park, Suwon-si (KR); Jong Min Kim, Daegu (KR); Jung Kwan Kim, Ansan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/227,412

(22) Filed: Apr. 12, 2021

(65) Prior Publication Data

US 2021/0233574 A1  Jul. 29, 2021

Related U.S. Application Data

(63) Continuation of application No. 16/934,134, filed on Jul. 21, 2020, now Pat. No. 11,004,484, which is a continuation-in-part of application No. 16/210,425, filed on Dec. 5, 2018, now Pat. No. 10,720,207.

(30) Foreign Application Priority Data

Jun. 15, 2018 (KR) .......................... 10-2018-0069081

(51) Int. Cl.
*G11C 7/00* (2006.01)
*G11C 7/06* (2006.01)
*G11C 7/10* (2006.01)
*G11C 11/4074* (2006.01)
*G11C 11/4094* (2006.01)

(52) U.S. Cl.
CPC .............. *G11C 7/065* (2013.01); *G11C 7/106* (2013.01); *G11C 7/1039* (2013.01); *G11C 7/1087* (2013.01); *G11C 11/4074* (2013.01); *G11C 11/4094* (2013.01)

(58) Field of Classification Search
CPC ....... G11C 7/1051; G11C 7/1078; G11C 7/22; G11C 7/106; G11C 7/1057
USPC .................................................... 365/189.05
See application file for complete search history.

(56) References Cited

U.S. PATENT DOCUMENTS

| | | |
|---|---|---|
| 6,816,421 B2 | 11/2004 | Tanzawa et al. |
| 7,149,115 B2 | 12/2006 | Ogura et al. |
| 7,187,584 B2 | 3/2007 | Chang |
| 7,675,777 B2 | 3/2010 | Lee et al. |
| 3,040,726 A1 | 10/2011 | Kwak |
| 8,526,238 B2 | 9/2013 | Moschiano et al. |

(Continued)

*Primary Examiner* — Son T Dinh
(74) *Attorney, Agent, or Firm* — Volentine, Whitt & Francos, PLLC

(57) ABSTRACT

A memory device includes a memory cell array having a plurality of memory cell strings, and a plurality of bit lines connected to at least one of the plurality of memory cell strings; and a plurality of page buffers connected to the plurality of bit lines, wherein each of the plurality of page buffers includes a plurality of latches sharing one data transfer node and exchanging data with each other through the data transfer node; and a pass transistor setting a connection between the data transfer node and another data transfer node of another page buffer.

20 Claims, 19 Drawing Sheets

(56) References Cited

U.S. PATENT DOCUMENTS

| | | | |
|---|---|---|---|
| 9,064,582 B2 | 6/2015 | Song et al. | |
| 9,183,940 B2 * | 11/2015 | Lee | G11C 11/5628 |
| 10,720,207 B2 * | 7/2020 | Cho | G11C 7/12 |
| 2008/0073789 A1 | 3/2008 | Harris | |
| 2010/0074011 A1 | 3/2010 | Kang et al. | |
| 2016/0351254 A1 | 12/2016 | Li et al. | |

* cited by examiner

PAGE BUFFER AND MEMORY DEVICE INCLUDING THE SAME

CROSS-REFERENCE TO RELATED APPLICATION

This application is a Continuation of U.S. application Ser. No. 16/934,134, filed Jul. 21, 2020, which issued as U.S. Pat. No. 11,004,484 on May 11, 2021, and which is a Continuation-In-Part (CIP) of U.S. patent application Ser. No. 16/210,425, filed Dec. 5, 2018, which issued as U.S. Pat. No. 10,720,207 on Jul. 21, 2020, and which is incorporated herein by reference in its entirety, and a claim of priority under 35 U.S.C. § 119 is made to Korean Patent Application No. 10-2018-0069081 filed on Jun. 15, 2018, in the Korean Intellectual Property Office, the entire contents of which are hereby incorporated by reference.

BACKGROUND

The present inventive concepts herein relate to page buffers, and memory devices including the same.

As the demand for high capacity memory devices having relatively small size has increased, interest and research in memory devices having vertically stacked memory cells have consequently increased. Memory devices may include page buffers for storing or outputting data. Page buffers may have a plurality of semiconductor elements. As the degree of integration of memory devices increases, the area of regions occupied by page buffers tends to decrease and the layout of conductive lines connected to the semiconductor elements of page buffers becomes increasingly complex.

SUMMARY

Embodiments of the inventive concepts provide a page buffer in which conductive lines connected to semiconductor elements of the page buffer may be effectively arranged to increase the degree of design freedom of circuits and layout, and a memory device including the same.

Embodiments of the inventive concepts provide a memory device including a memory cell array having a plurality of memory cell strings, and a plurality of bit lines connected to the plurality of memory cell strings; and a plurality of page buffers connected to the plurality of bit lines. Each of the plurality of page buffers includes a plurality of latches and a pass transistor. The plurality of latches share one data transfer node and exchange data with each other through the data transfer node. The pass transistor sets a connection between the data transfer node and another data transfer node of another page buffer from among the plurality of page buffers.

Embodiments of the inventive concepts further provide a memory device including a memory cell array having a plurality of memory cell strings, and a plurality of bit lines connected to the plurality of memory cell strings; a page buffer circuit including a plurality of page buffers connected to the plurality of bit lines, each of the plurality of page buffers having a plurality of latches exchanging data with each other through one data transfer node; and a control logic controlling connection of the data transfer nodes of at least some of the plurality of page buffers to each other to identify the data stored in the plurality of page buffers, and disconnection of the data transfer nodes of the plurality of page buffers from each other to exchange the data between the plurality of latches in each of the plurality of page buffers.

Embodiments of the inventive concepts still further provide a page buffer including a plurality of semiconductor elements formed in a first region of a semiconductor substrate and configured to provide a latch connected to at least one of a plurality of bit lines through a sensing node; a first latch signal line disposed on a first level in the first region and connected to a first node of the latch; a second latch signal line disposed on the first level and connected to a second node of the latch, wherein a voltage of the first node and a voltage of the second node are complementary; and a sensing line disposed between the first latch signal line and the second latch signal line on the first level, and configured to provide the sensing node.

Embodiments of the inventive concepts also provide a page buffer including a first data transfer line; a pass transistor configured to set a connection between the first data transfer line and a second data transfer line of another page buffer; a plurality of latches connected to the first data transfer line and configured to exchange data with each other through the first data transfer line; and a control logic configured to activate the pass transistor to connect the first and second data transfer lines during a data identification mode and deactivate the pass transistor to disconnect the first and second data transfer lines during exchange of the data between the plurality of latches.

BRIEF DESCRIPTION OF DRAWINGS

The above and other aspects, features, and advantages of the inventive concepts will be more clearly understood from the following detailed description, taken in conjunction with the accompanying drawings, in which.

DETAILED DESCRIPTION

Hereinafter, example embodiments of the present inventive concept will be described with reference to the accompanying drawings.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
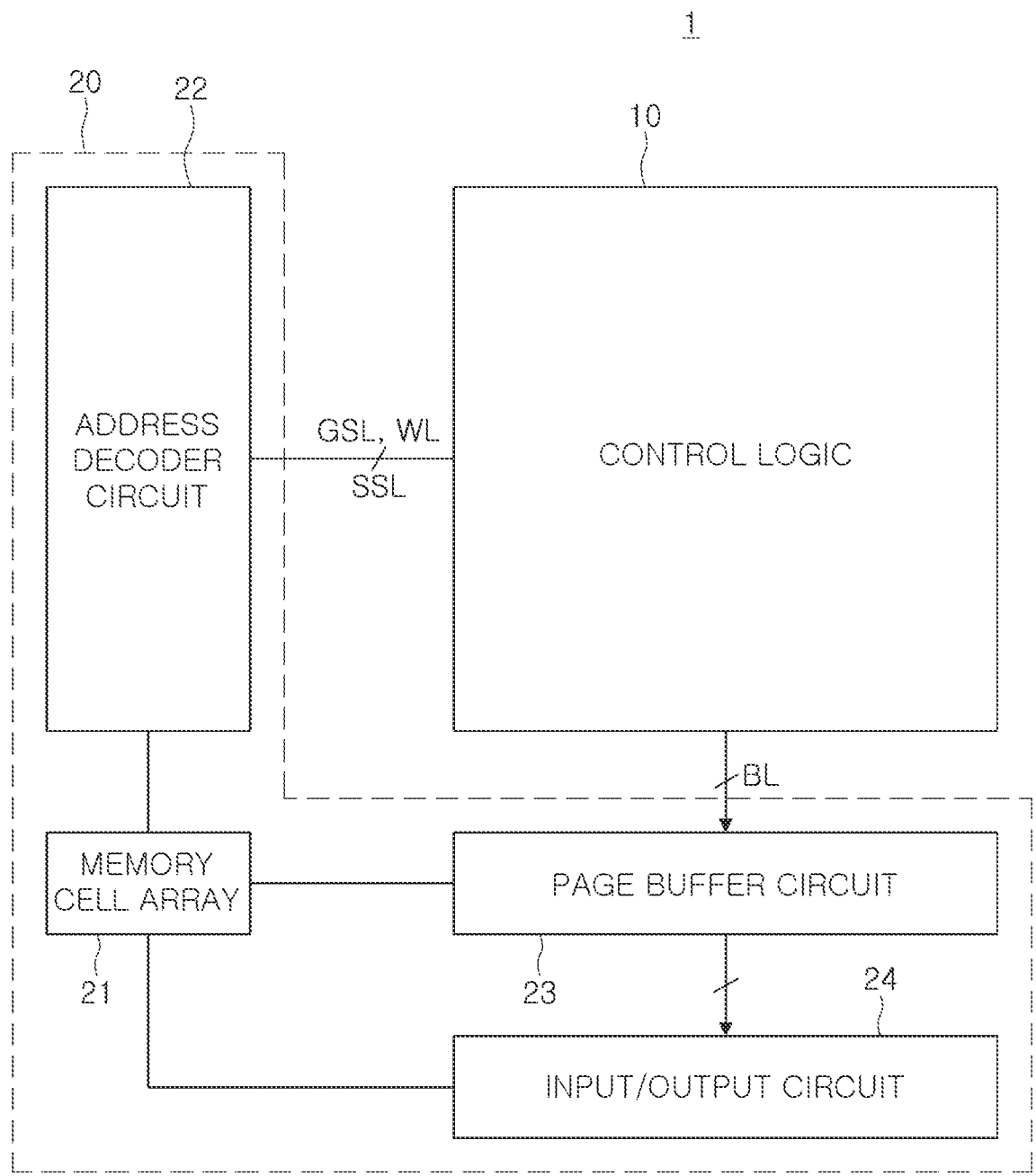
FIG. 1 illustrates a block diagram of a memory device according to an embodiment of the inventive concepts.

FIG. 1 illustrates a block diagram of a memory device according to an embodiment of the inventive concepts.

Referring to FIG. 1, memory device 1 includes a memory cell array 10 and a memory controller 20. The memory cell array 10 may include a plurality of memory cells MC, and at least a portion or some of the plurality of memory cells may be connected to each other to provide a memory cell string. The memory cell array 10 may include a plurality of memory cell strings, and the plurality of memory cell strings may be divided into a plurality of blocks. The memory controller 20 includes a control logic (e.g., a circuit) 21, an address decoder circuit 22, a page buffer circuit 23, and an input/output circuit 24. The memory device 1 may include additional circuits not shown.

The address decoder circuit 22 is connected to the memory cells MC through word lines WL, string selection lines SSL, and ground selection lines GSL, among other lines (not shown). The page buffer circuit 23 is connected to the memory cells MC through bit lines BL. In an embodiment, the address decoder circuit 22 may select a memory cell MC to which data is to be written or from which data is to be read, and may receive address information for selecting the memory cell MC.

The page buffer circuit 23 may write data to a memory cell MC or read data from a memory cell MC, and may write or read data on a page basis. The page buffer circuit 23 may include a plurality of page buffers, and each of the plurality of page buffers may be connected to at least one bit line BL. Data to be written to the memory cell array 10 by the page buffer circuit 23 may be input through the input/output circuit 24, and data may be read from the memory cell array 10 by the page buffer circuit 23 and output through the input/output circuit 24. Operations of the address decoder circuit 22, the page buffer circuit 23, and the input/output circuit 24 may be controlled by the control logic 21. For example, control logic 21 may provide various control signals to the plurality of transistors TR1 to TR25 in page buffer 400 to enable counting (e.g., identifying) of data within latches of page buffer 400 and/or to enable exchange (e.g., transfer) of data between latches for example, as will be subsequently described with reference to FIGS. 7 and 10-15.

Figure 2:
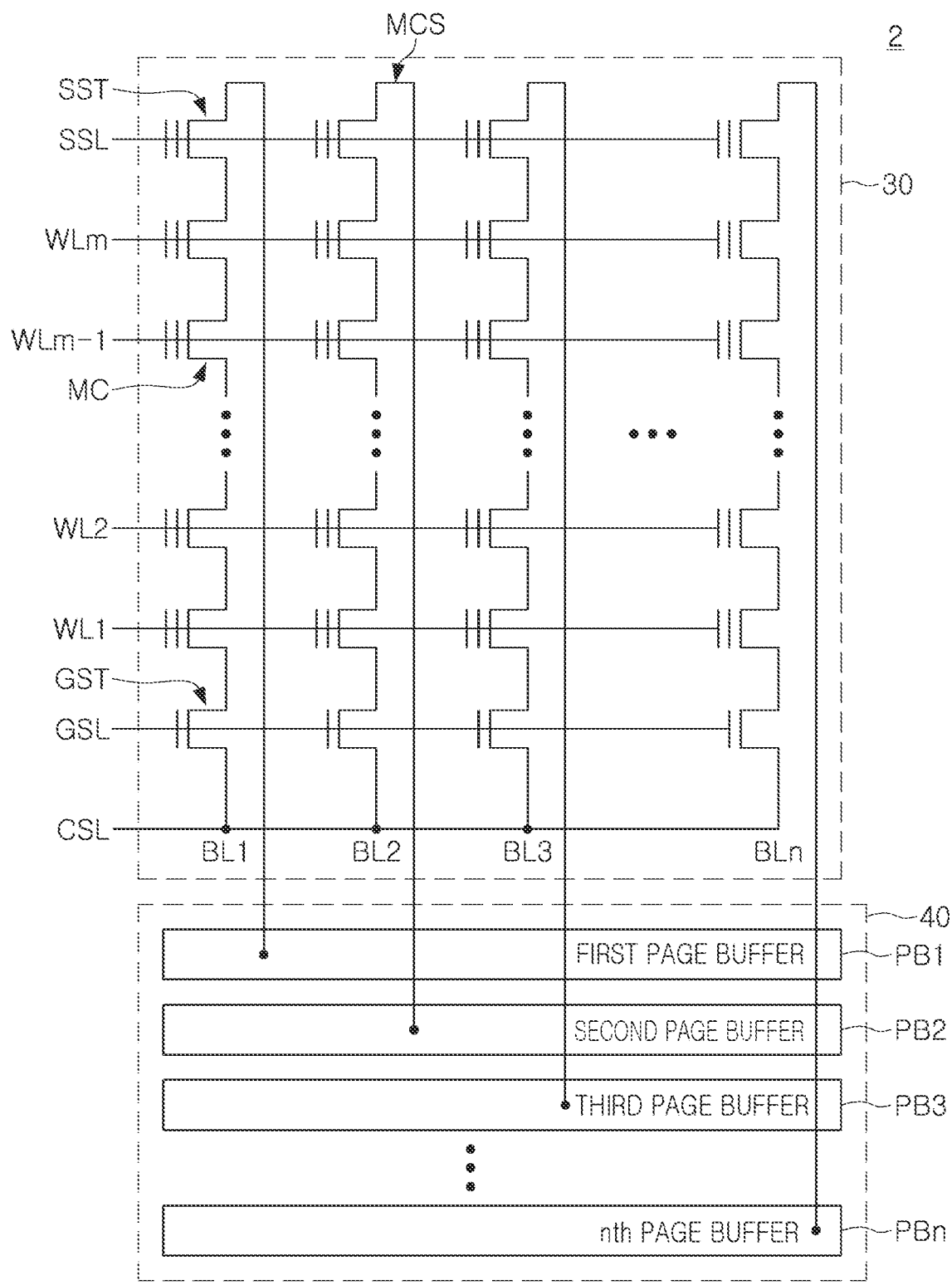
FIG. 2 illustrates a diagram of a connection relationship between a memory cell array and a page buffer in a memory device according to an embodiment of the inventive concepts.

FIG. 2 illustrates a diagram of a connection relationship between a memory cell array and a page buffer in a memory device according to an embodiment of the inventive concepts.

Referring to FIG. 2, memory device 2 includes a plurality of memory cells MC included in memory block 30 and a plurality of page buffers PB1 to PBn included in page buffer circuit 40. Some of the plurality of memory cells MC may be connected to each other, and such connected memory cells provide a plurality of memory cell strings MCS. The plurality of memory cell strings MCS are provided at respective points at which a plurality of word lines WL1 to WLm and a plurality of bit lines BL1 to BLn intersect.

Each of the plurality of memory cell strings MCS further includes a string selection transistor SST and a ground selection transistor GST, in addition to the memory cells MC. The string selection transistors SST in the plurality of memory cell strings MCS are respectively connected to the plurality of bit lines BL1 to BLn, and are controlled through a string selection line SSL. The ground selection transistors GST in the plurality of memory cell strings MCS are respectively connected to a common source line CSL, and may be controlled through a ground selection line GSL.

In an embodiment of the inventive concepts as illustrated in FIG. 2, the ground selection transistors GST have a structure different from that of the memory cells MC, and the string selection transistors SST have a same structure as the memory cells MC. However, in other embodiments the ground selection transistors GST may have a same structure as that of the memory cells MC, and the string selection transistors SST may have a structure different than a structure of the memory cells MC. When a plurality of memory cell strings MCS are formed in a three-dimensional structure, each of the plurality of bit lines BL1 to BLn may be connected to a plurality of memory cell strings MCS connected to different string selection lines SSL.

The plurality of memory cell strings MCS may be included in one memory block 30, and the memory cell array may include a plurality of memory blocks 30. When the memory cell strings MCS included in the memory block 30 are connected to n bit lines BL1 to BLn, the page buffer circuit 40 may include n page buffers PB1 to PBn corresponding to the bit lines BL1 to BLn. In a similar manner to the embodiment illustrated in FIG. 2, each of the page buffers PB1 to PBn may be connected to each of the bit lines BL1 to BLn, and may temporarily store data to be stored or read, through the bit lines BL1 to BLn. The page buffers PB1 to PBn may include at least one latch circuit for temporarily storing data.

For example, in the architecture of the memory device 2, the page buffers PB1 to PBn connected to one memory block 30 may be arranged in a predetermined direction (a longitudinal direction in FIG. 2). Each of the page buffers PB1 to PBn may include, in addition to a latch circuit, a connection circuit for connecting the bit lines BL1 to BLn to the latch circuit, a precharge circuit for precharging a sensing node to store or read data, or the like. Each of the page buffers PB1 to PBn may include a plurality of semiconductor elements for implementing the circuits.

FIGS. 3A to 5 illustrate diagrams of a structure of a page buffer according to an embodiment of the inventive concepts.

Figures 3A, 3B:
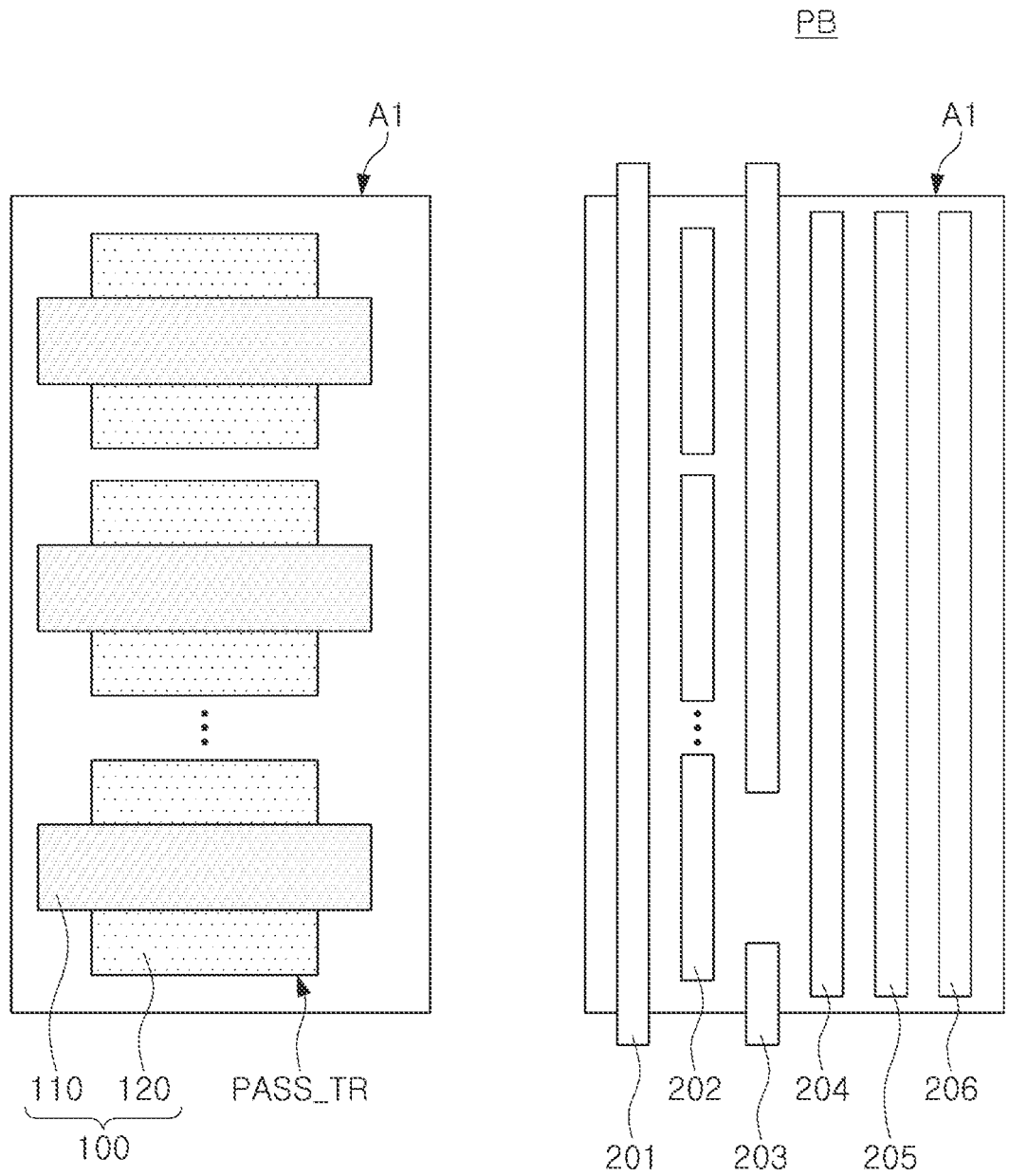
FIGS. 3A and 3B illustrate diagrams of different layers of a structure of a page buffer according to an embodiment of the inventive concepts.

FIGS. 3A and 3B illustrate diagrams of different layers of a structure of a page buffer according to an embodiment of the inventive concepts. Referring to FIGS. 3A and 3B, a page buffer PB may include a plurality of layers. In an embodiment of the inventive concepts as shown, although only semiconductor elements 100 are included in a layer shown in FIG. 3A, and conductive lines 201 to 206 are included in a layer shown in FIG. 3B that is formed on upper portions of the semiconductor elements 100, the page buffer PB may further include other components and/or layers. In one example, conductive lines may be further disposed on upper portions of the conductive lines 201 to 206 in a Z axis direction, or vias may be provided to connect the conductive lines 201 to 206 and the semiconductor elements 100.

As described above, the page buffer PB may include a plurality of semiconductor elements 100 for providing or configuring a latch circuit, a connection circuit, a precharge circuit, and the like. The plurality of semiconductor elements 100 may be disposed in a first region A1 of a semiconductor substrate for forming a page buffer PB. As a degree of integration of the memory device increases and an interval between the memory cell strings connected to the page buffer PB decreases, the plurality of semiconductor elements 100 included in one page buffer PB may be arranged in a specific direction. In an embodiment illustrated in FIGS. 3A and 3B, the plurality of semiconductor elements 100 may be arranged in a first direction (a Y axis direction) in the first region A1 of the semiconductor substrate for providing a page buffer PB.

Each of the plurality of semiconductor devices 100 may include a gate electrode 110, and an active region 120 intersecting the gate electrode 110 and providing a source/drain region. At least one of the gate electrode 110 and the active region 120 of each of the plurality of semiconductor elements 100 may be connected to at least one of the conductive lines 201 to 206 provided on the upper portion of the semiconductor elements 100. In an embodiment illustrated in FIGS. 3A and 3B, the conductive lines 201 to 206 may be arranged on a first level on the upper portion of the first region A1 in the Z axis direction.

In one example, at least one of the gate electrode 110 and the active region 120 of each of the plurality of semiconductor devices 100 may be connected to at least one of the conductive lines 201 to 206 formed on the first level. The plurality of semiconductor elements 100 may be connected to each other by the conductive lines 201 to 206 to provide a connection circuit, a precharge circuit, a latch circuit, and the like of the page buffer PB.

Each of the plurality of conductive lines 201 to 206 formed on the first level may be connected to at least one of the plurality of semiconductor elements 100. In one example, the conductive lines 201 to 206 may include a line for connecting the page buffer PB to an external cache latch, a line for supplying a power supply voltage, a line for connecting the page buffer PB to a monitoring circuit, a line for transferring signals of the latch circuit included in the page buffer PB, a line for connecting to the sensing node of the page buffer PB, and the like. Hereinafter, for convenience of explanation, it is assumed that each of the conductive lines 201 to 206 may be matched with one of the lines exemplified above, but the inventive concepts however are not necessarily limited to the examples according to this assumption. For example, in other embodiments the number and arrangement order of the conductive lines 201 to 206 may be variously modified.

For example, the conductive lines 201 to 206 may include a cache latch line for connecting the page buffer PB to an external cache latch, and a power supply line for supplying a power supply voltage. In one example, the power supply line may be divided into a plurality of regions to supply a plurality of power supply voltages having different magnitudes. The cache latch line may also be divided into a plurality of regions, and the plurality of regions of the cache latch lines may be selectively connected to or disconnected from each other by at least one of the plurality of semiconductor elements 100.

Also, at least one of the plurality of conductive lines 201 to 206 may be used for transferring data between the latch circuits included in the page buffer PB, or may be used as a wired OR line (or in other words used in a wired OR configuration) connected to a monitoring circuit identifying data stored in the page buffer PB. The monitoring circuit may count data stored in the page buffer PB through the wired OR line. In an embodiment, the wired OR line may be divided into a plurality of regions, and the plurality of regions may be selectively connected or disconnected by a pass transistor PASS_TR of the plurality of semiconductor elements 100. At least one of the plurality of regions may be connected to a pass transistor of another page buffer adjacent in the first direction (the Y axis direction).

For example, in a monitoring operation in which the monitoring circuit identifies data stored in the page buffer PB, the pass transistor PASS_TR may be turned on, and a plurality of regions included in the wired or line may be connected to each other. Further, the pass transistor PASS_TR may be turned off, and a plurality of regions included in the wired OR line may be used for data transfer between the latch circuits included in the page buffer PB.

Meanwhile, the plurality of conductive lines 201 to 206 may include latch signal lines for transferring signals of the latch circuit, and sensing node lines for providing sensing nodes of the page buffer PB. In one embodiment, signals having characteristics complementary to each other may be transferred through the latch signal lines. The page buffer PB may store data in the memory cells or read data from the memory cells, by using a method of precharging the sensing node and then developing the sensing node. Therefore, the sensing node needs to be effectively shielded from external noise. In an embodiment, the sensing node may be effectively protected from external noise by arranging the sensing node line between the latch signal lines transferring signals having complementary characteristics.

Although the function of the conductive lines 201 to 206 has been described above for the sake of convenience of explanation, the number and arrangement of the conductive lines 201 to 206 according to embodiments may be variously modified. The number of conductive lines 201 to 206 may be more or less than six. In addition, depending on the number of conductive lines 201 to 206, other functions may be added to the functions described above, or a portion of the functions described above may be provided in conductive lines of other layers.

Figure 4:
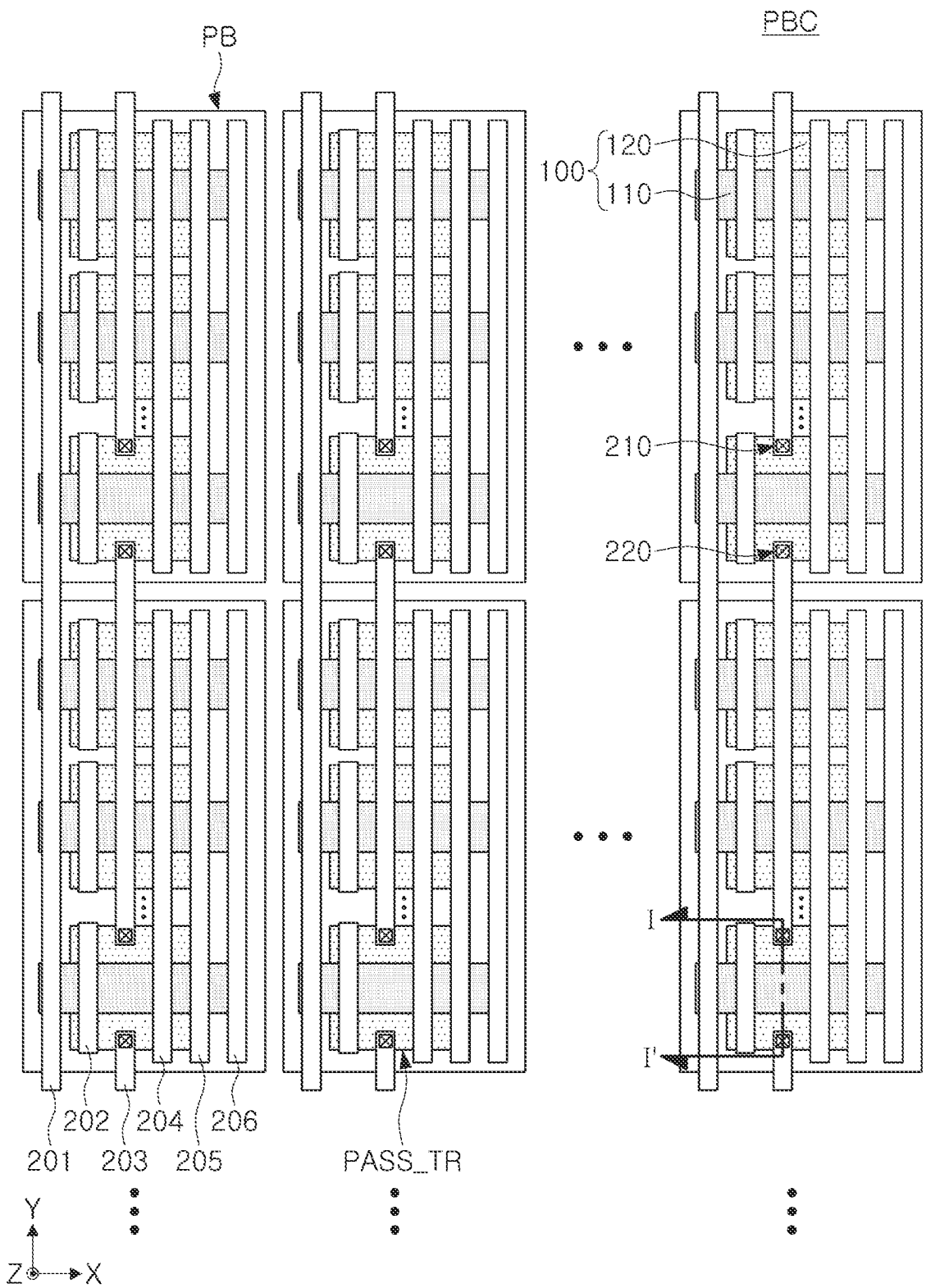
FIG. 4 illustrates a diagram of a structure of a plurality of page buffers in a page buffer circuit according to an embodiment of the inventive concepts.

FIG. 4 illustrates a diagram of a structure of a plurality of page buffers in a page buffer circuit according to an embodiment of the inventive concepts. Referring to FIG. 4, a page buffer circuit PBC may include a plurality of page buffers PB. In an embodiment illustrated in FIG. 4, it can be understood that the page buffers PB arranged in a first direction (a Y axis direction) in series and located in the same position of a second direction (an X axis direction) may be connected to the same memory block. The first and second directions are orthogonal with respect to each other.

In an embodiment illustrated in FIG. 4, the plurality of conductive lines 201 to 206 may be disposed on a first level defined on an upper portion of the plurality of semiconductor elements 100 in a Z axis direction. As described above, each of the plurality of conductive lines 201 to 206 may be connected to at least one of the plurality of semiconductor elements 100 to provide a latch circuit, a precharge circuit, a connection circuit, and the like.

As described above with reference to FIGS. 3A and 3B, a third conductive line 203 may be divided into a plurality of regions in the first direction (the Y axis direction). The plurality of regions included in the third conductive line 203 may be connected to or disconnected from each other by the pass transistor PASS_TR included in each of the page buffers PB. When the third conductive line 203 is to be connected to the monitoring circuit, the pass transistor PASS_TR is turned on, such that at least a portion of the plurality of regions may be connected to each other. In addition, when the third conductive line 203 is to be used as the data transfer node of each page buffer PB, the pass transistor PASS_TR is turned off. For efficient placement of the third conductive line 203, the pass transistor PASS_TR may be located on a lowermost end of the page buffers PB in the first direction (the Y axis direction). That is, the pass transistor PASS_TR may be disposed as the first device or component of a page buffer PB along the first direction (Y axis direction).

A first conductive line 201 may extend in the first direction on the page buffers PB connected to one memory block. The first conductive line 201 may extend to the cache latches located on a lower portion of the page buffers PB in the first direction. A second conductive line 202 may be a line for supplying power supply voltages as described above, and may be divided into a plurality of regions to supply a first power supply voltage and a second power supply voltage having different magnitudes.

Figure 5:
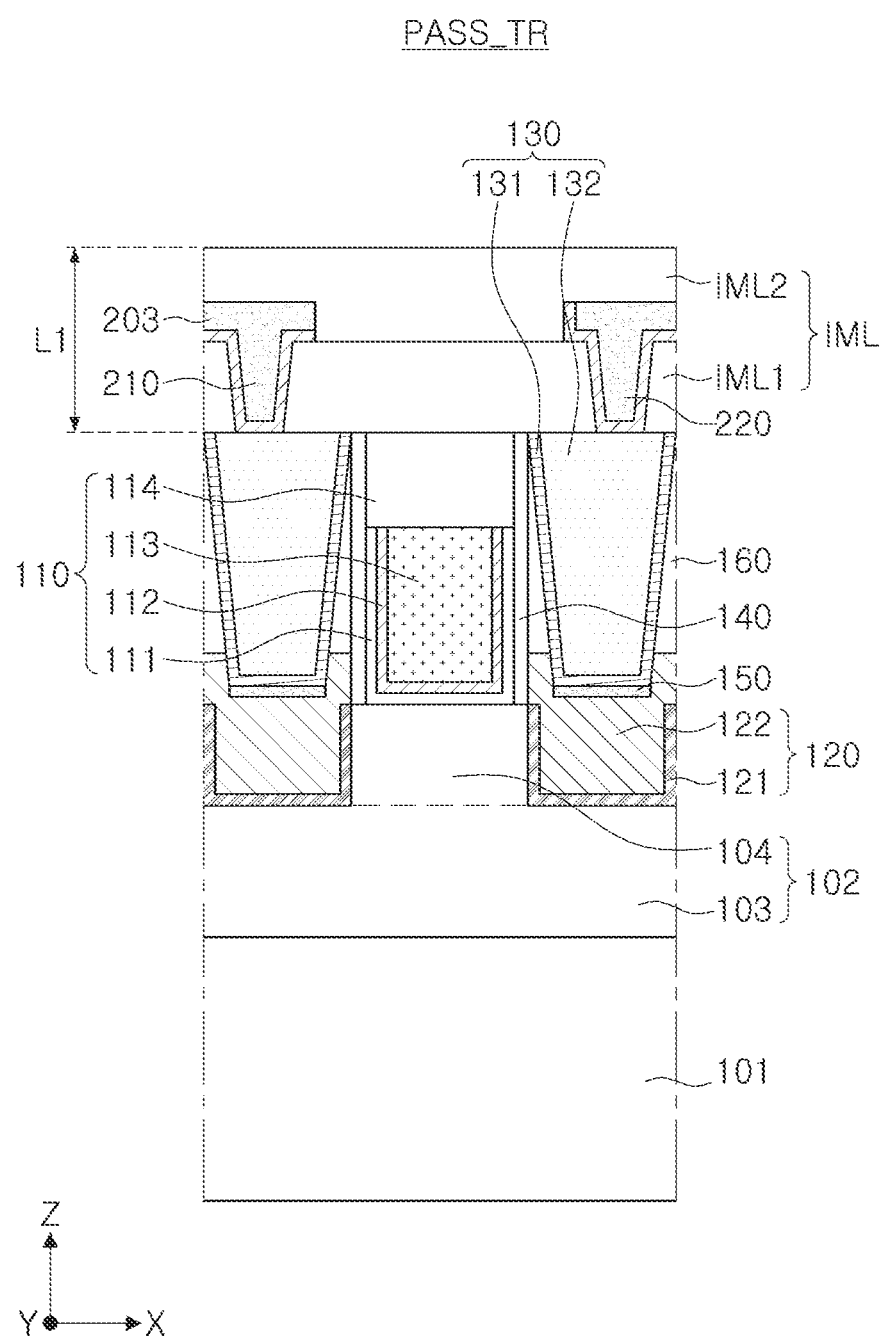
FIG. 5 illustrates a cross-sectional view of a structure of a page buffer as taken along line I-I' of FIG. 4 according to an embodiment of the inventive concepts.

FIG. 5 illustrates a cross-sectional view of a structure of a page buffer as taken along line I-I' of FIG. 4 according to an embodiment of the inventive concepts. FIG. 5 illustrates a structure of a pass transistor PASS_TR capable of connecting or disconnecting a plurality of regions included in a third conductive line 203. In an embodiment illustrated in FIG. 5, it is assumed that the pass transistor PASS_TR may be a FINFET including a pin structure, but is not limited thereto, and may be modified into various structures.

Referring to FIG. 5, a pass transistor PASS_TR includes a gate electrode 110 and an active region 120, formed on a fin structure 102 of a semiconductor substrate 101. The fin structure 102 includes a first fin region 103 extending from the semiconductor substrate 101 and a second fin region 104 extending from the first fin region 103. The gate electrode 110 is formed to cross over the second fin region 104 on the first fin region 103. The active region 120 extends from the first fin region 103. For example, the active region 120 may be formed by applying a selective epitaxy growth process to the first fin region 103. The active region 120 may include a first layer 121 and a second layer 122.

The gate electrode 110 may be formed in the spacer 140, and may include a gate insulating layer 111, a first gate metal layer 112, a second gate metal layer 113, a capping layer 114, and other layers. A stacked structure of the gate electrode 110 may be variously modified according to embodiments.

In one example, at least one of the first gate metal layer 112 and the second gate metal layer 113 may comprise a plurality of layers.

The active region 120 is connected to a contact 130. The contact 130 may be formed by way of removing a portion of an interlayer insulating layer 160 formed to surround the gate electrode 110 by an etching process, and filling a space in which the portion of interlayer insulating layer 160 is removed with a conductive material. The contact 130 may have a first contact layer 131 and a second contact layer 132. The first contact layer 131 may be a barrier metal layer, and the second contact layer 132 may be a fill metal layer. An additional contact layer 150 may be disposed between the first contact layer 131 and the second layer 122 of the active region 120. Also, for example, an upper surface of the contact 130 may be co-planar with an upper surface of the gate electrode 110, and an upper insulating layer IML may be formed on the upper surfaces of the gate electrode 110 and the contact 130. The upper insulating layer IML may include a plurality of layers IML1 and IML2, and a region in which the upper insulating layer IML is formed may be defined as a first level L1 on an upper portion of the semiconductor substrate 101.

In one example, conductive lines 201 to 206 and vias 210 and 220 may be formed in the upper insulating layer IML. A third conductive line 203 is illustrated in FIG. 5, and the third conductive line 203 may be divided into a plurality of regions by the pass transistor PASS_TR. Each of the plurality of regions included in the third conductive line 203 may be connected to each of the active regions 120 of the pass transistor PASS_TR through a first via 210 and a second via 220. Accordingly, the plurality of regions included in the third conductive line 203 may be connected to or disconnected from each other according to on/off of the pass transistor PASS_TR.

Figure 6:
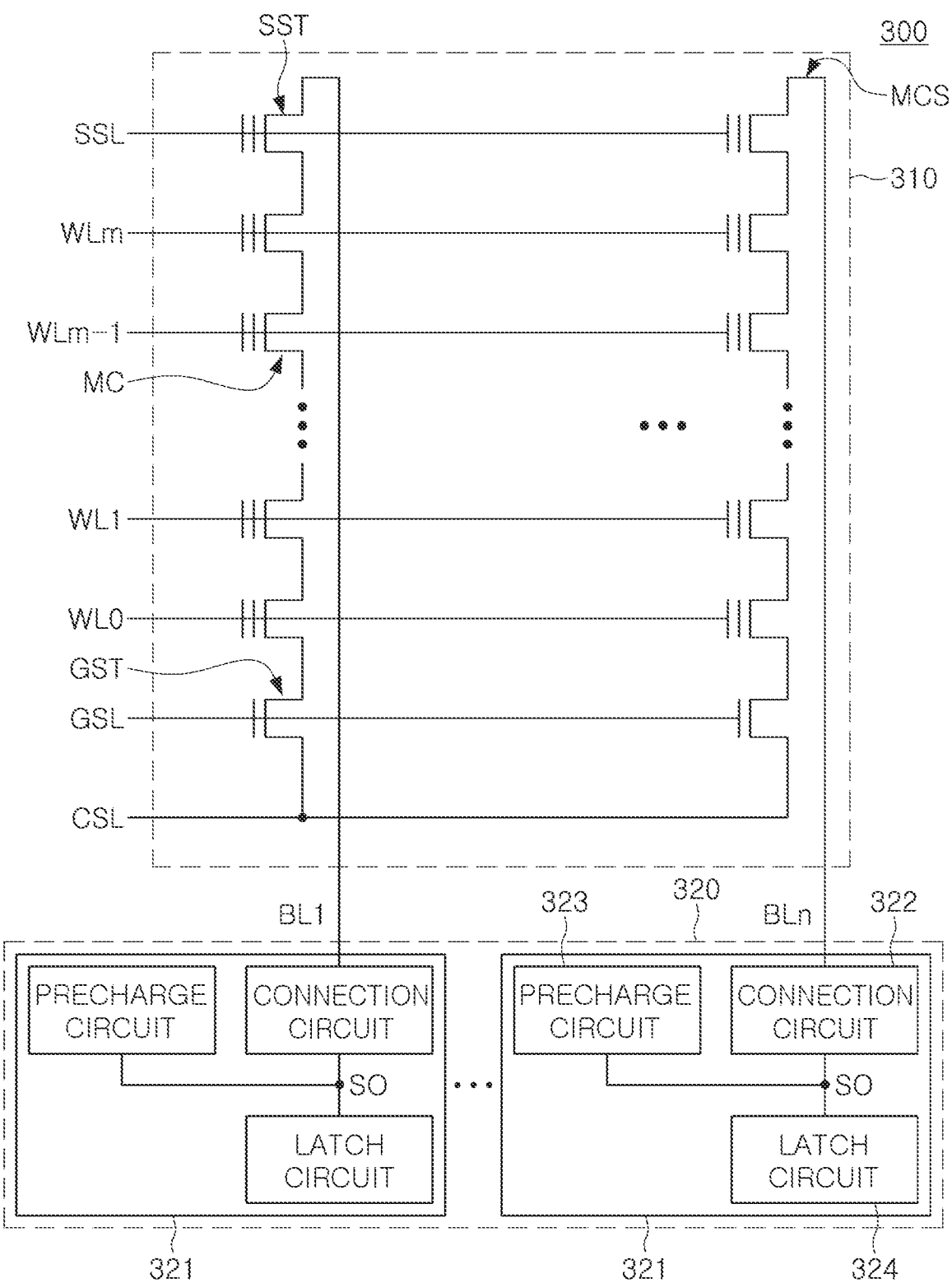
FIG. 6 illustrates a block diagram of a page buffer according to an embodiment of the inventive concepts.

FIG. 6 illustrates a block diagram of a page buffer according to an embodiment of the inventive concepts.

Referring to FIG. 6, a memory device 300 includes a memory cell array 310 having a plurality of memory cell strings MCS, and a page buffer circuit 320. A structure of each of the plurality of memory cell strings MCS may be the same as described previously with respect to FIG. 2 for example. The page buffer circuit 320 includes a plurality of page buffers 321. Each of the page buffers 321 includes a connection circuit 322, a precharge circuit 323, and a latch circuit 324. In one embodiment, a node to which the connection circuit 322, the precharge circuit 323, and the latch circuit 324 are connected may be defined as a sensing node SO.

Each of the page buffers 321 may include a plurality of semiconductor elements, and the plurality of semiconductor elements may be arranged in a predetermined direction in a line within a region assigned to each of the page buffers 321. The plurality of semiconductor elements may be connected to each other through a plurality of conductive lines formed thereon to provide the connection circuit 322, the precharge circuit 323, and the latch circuit 324. Thus, it is necessary to efficiently design layout of the conductive lines to provide the connection circuit 322, the precharge circuit 323, and the latch circuit 324 with a limited number of conductive lines.

In an embodiment, one of the conductive lines may be utilized for transferring data between the plurality of latches included in the latch circuit 324, and as a connection to a monitoring circuit using the wired OR mode (or a wired OR configuration). Thus, the degree of design freedom of each of the page buffers 321 may be relatively improved by increasing the utilization of a limited number of conductive lines. Further, data transfer between the plurality of latches may be conducted by separately configuring the conductive line used for transferring data between the plurality of latches and the conductive line connected to the sensing node SO, when the sensing node SO is developed.

Figure 7:
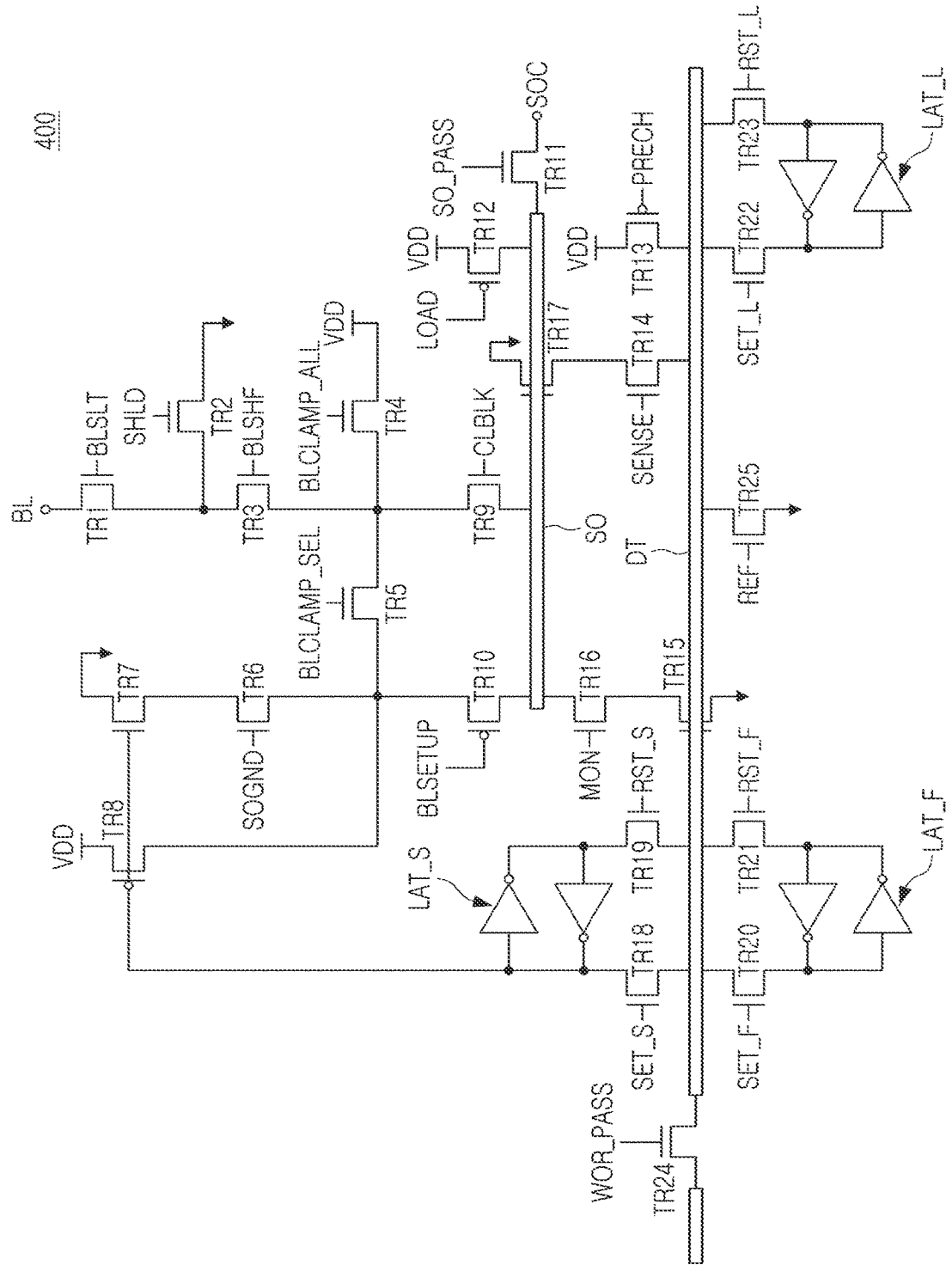
FIG. 7 illustrates a circuit diagram of a page buffer according to an embodiment of the inventive concepts.

FIG. 7 illustrates a circuit diagram of a page buffer according to an embodiment of the inventive concepts.

Referring to FIG. 7, a page buffer 400 according to an embodiment includes a plurality of transistors TR1 to TR25 and a plurality of latches LAT_S, LAT_L, and LAT_F. The plurality of transistors TR1 to TR25 may provide a connection circuit for connecting a sensing node SO and a data transfer node DT to a bit line BL, a precharge circuit for precharging the sensing node SO or the data transfer node DT, a circuit for controlling each of the plurality of latches LAT_S, LAT_L, and LAT_F, and the like. For example, the plurality of latches LAT_S, LAT_L, and LAT_F may include a sensing latch LAT_S and a plurality of data latches LAT_L and LAT_F.

In an embodiment illustrated in FIG. 7, the page buffer 400 may further include a data transfer node DT, in addition to the sensing node SO. The data transfer node DT may be connected to or disconnected from a data transfer node DT of another page buffer through the pass transistor TR24. For example, when the page buffer 400 is connected to a monitoring circuit for counting data stored in the latches LAT_S, LAT_L, and LAT_F of the page buffer 400, the pass transistor TR24 may be turned on. A data exchange between the latches LAT_S, LAT_L, and LAT_F may not be performed while the pass transistor TR24 is turned on, and the monitoring circuit may use the data transfer node DT to count data stored in the latches LAT_S, LAT_L, and LAT_F in a wired OR mode.

When the latches LAT_S, LAT_L, and LAT_F perform data transfer operations through the data transfer node DT, the pass transistor TR24 may be turned off. Thus, while the latches LAT_S, LAT_L, and LAT_F are exchanging data with each other, the data transfer node DT of the page buffer 400 may be disconnected from a data transfer node DT of the other adjacent page buffer. The pass transistor thus sets (in other words turns on or off) a connection between the data transfer node DT of page buffer 400 and a data transfer node DT of another page buffer. The pass transistor may be characterized as activated during a data identification mode and thus turned on to provide connection between the data transfer node DT of page buffer 400 and a data transfer node DT of another page buffer, and deactivated and thus turned off during exchange of data between the latches LAT_S, LAT_L, and LAT_F.

Meanwhile, in an embodiment illustrated in FIG. 7, each of the plurality of transistors TR1 to TR25 may be connected to at least one conductive line. The conductive line may be lines formed on upper portions of the plurality of transistors TR1 to TR25, as described previously. For example, one of the active regions of the second transistor TR2 and the seventh transistor TR7 may be connected to a conductive line providing a second power supply voltage GND, and one of the active regions of the twelfth transistor TR12 and the thirteenth transistor TR13 may be connected to a conductive line providing a first power supply voltage VDD. In addition, one of the active regions of the eleventh transistor TR11 may be connected to a conductive line connecting the page buffer 400 to a cache latch.

Figure 8:
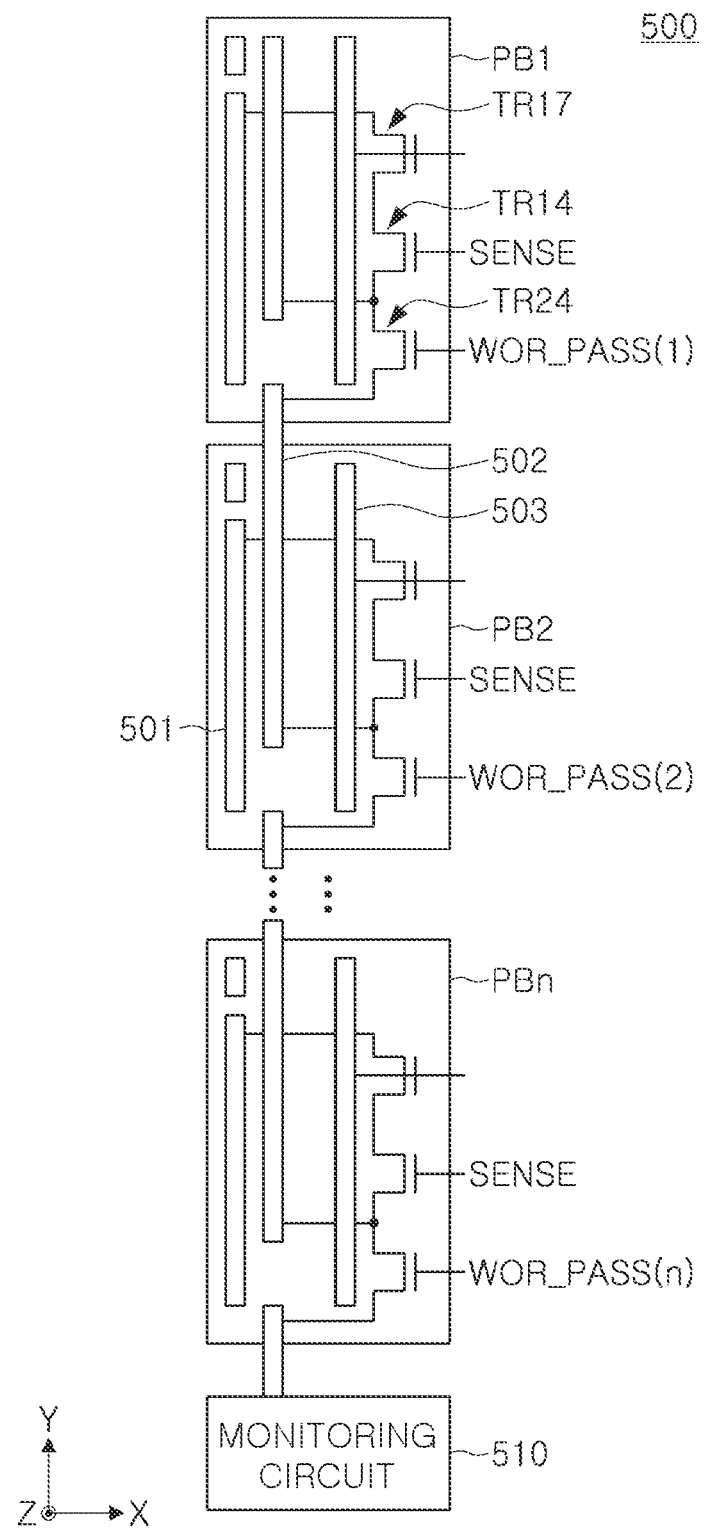
FIG. 8 illustrates a circuit diagram of a layout of a page buffer according to an embodiment of the inventive concepts.

FIG. 8 illustrates a circuit diagram of a layout of a page buffer according to an embodiment of the inventive concepts.

Referring to FIG. 8, a page buffer circuit 500 according to an embodiment includes a plurality of page buffers PB1 to PBn. As described above, each of the plurality of page buffers PB1 to PBn may be connected to corresponding bit lines. The plurality of page buffers PB1 to PBn may each include a plurality of transistors TR1 to TR25 and a plurality of latches LAT_S, LAT_L, and LAT_F (not shown), as described above with reference to FIG. 7. The plurality of transistors TR1 to TR25 may be arranged in one direction in each of the page buffers PB1 to PBn.

For example, referring to the first page buffer PB1 in FIG. 8, a pass transistor TR24 may be disposed at a lowermost end of a region assigned to the first page buffer PB1. That is, the pass transistor PASS_TR24 may be disposed as the first device or component of the first page buffer PB1 along the first direction (Y axis direction). A fourteenth transistor TR14 and a seventeenth transistor TR17 may be connected to the pass transistor TR24. At least a portion or some of the plurality of transistors TR1 to TR25 included in the first page buffer PB1 may be connected to conductive lines. In an embodiment illustrated in FIG. 8, a power supply line 501 for supplying power supply voltages VDD and GND, a data transfer line 502 for providing a data transfer node DT, and a sensing line 503 for providing a sensing node SO only are illustrated. Lines for transferring a latch signal, lines for connecting to a cache latch, and the like may be additionally provided.

Referring to FIG. 8, data transfer lines 502 included in page buffers PB1 to PBn adjacent to each other may be connected to or disconnected from each other by a pass transistor TR24 included in each of a plurality of page buffers PB1 to PBn. For example, when a monitoring circuit 510 monitors data stored in at least one of latches LAT_S, LAT_L, and LAT_F of the first page buffer PB1, the pass transistors TR24 of all the page buffers PB1 to PBn may be turned on.

Meanwhile, when the monitoring circuit 510 monitors data stored in at least one of the latches LAT_S, LAT_L, and LAT_F of the second page buffer PB2, the pass transistor TR24 of the first page buffer PB1 may be turned off, and the pass transistors TR24 of the remaining page buffers PB2 to PBn may be turned on. In addition, when the monitoring circuit 510 monitors data stored in at least one of the latches LAT_S, LAT_L, and LAT_F of the $n^{th}$ page buffer PBn, all of the pass transistors TR24 of the page buffers PB1 to PBn−1 may be turned off. For example, in embodiments, the monitoring circuit 510 may selectively turn on/off the pass transistor TR24 included in each of the plurality of page buffers PB1 to PBn, depending on an object to be monitored. Therefore, power to be consumed in the monitoring operation may be effectively managed.

For example, when the monitoring circuit 510 monitors data of the latches LAT_S, LAT_L, and LAT_F included in the $n^{th}$ page buffer PBn, the monitoring circuit 510 may precharge a data transfer line 502 connected to the data transfer node DT to a predetermined power supply voltage VDD. The monitoring circuit 510 may perform a monitoring operation by developing a voltage of the data transfer line 502 precharged with data of the latches LAT_S, LAT_L, and LAT_F included in the $n^{th}$ page buffer PBn.

In a conventional layout in which a line providing a wired OR connection for a monitoring operation always connects the monitoring circuit 510 and all of the page buffers PB1 to PBn, the monitoring circuit 510 may need to precharge the same length of the line, regardless of an object to be monitored. Thus, in conventional layouts power to be consumed in the monitoring operation may increase. In contrast, in embodiments of the inventive concepts, a length of the data transfer line 502 which the monitoring circuit 510 needs to precharge depends on a location of an object to be monitored, and the length may be adjusted by selectively turning on/off the pass transistors TR24 included in each of the plurality of page buffers PB1 to PBn. Therefore, power consumed during the monitoring operation may be efficiently managed.

Figure 9:
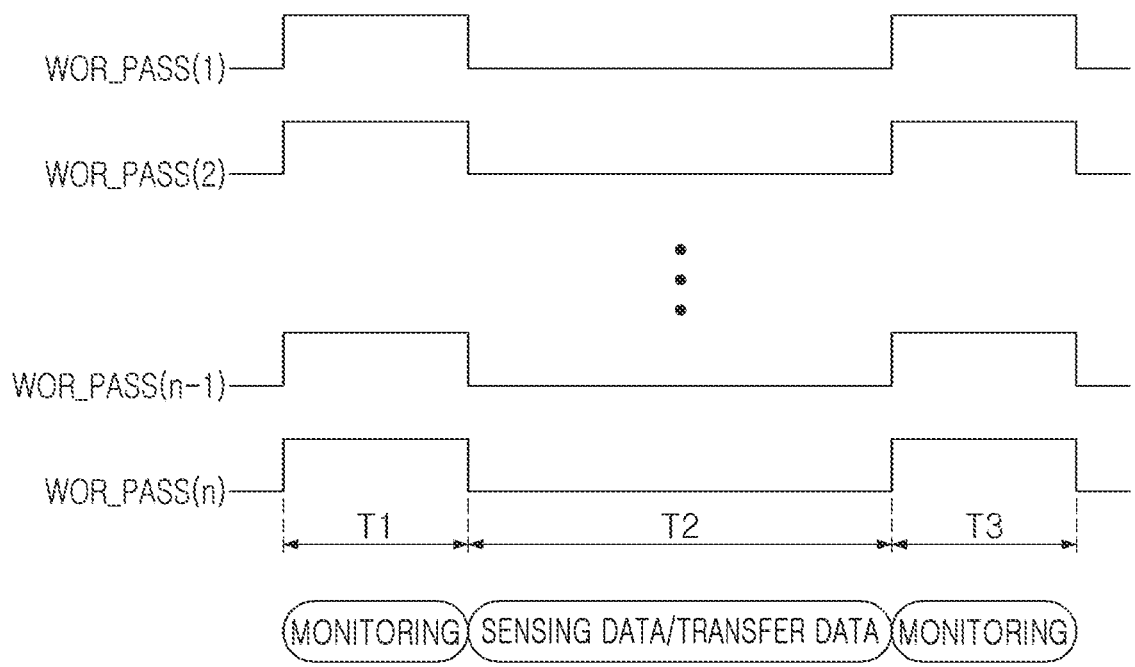
FIG. 9 illustrates a timing diagram of an operation of a page buffer according to an embodiment of the inventive concepts.

FIG. 9 illustrates a timing diagram of an operation of a page buffer according to an embodiment of the inventive concepts.

Referring together to FIGS. 8 and 9, on/off switching of the pass transistors TR24 included in each of the page buffers PB1 to PBn may be controlled by a pass control signal WOR_PASS. For example, pass control signal WOR_PASS(1) may control on/off switching of the pass transistor TR24 in page buffer PB1, pass control signal WOR_PASS(2) may control on/off switching of the pass transistor TR24 in page buffer PB2, and pass control signal WOR_PASS(n) may control on/off switching of the pass transistor TR24 in page buffer PBn. In an embodiment illustrated in FIG. 9, during a first period T1 (e.g., a monitoring period), the pass transistors TR24 included in all page buffers PB1 to PBn are turned on. Thus, the data transfer nodes DT of all the page buffers PB1 to PBn are connected to the monitoring circuit 510 through the data transfer line 502 in the wired OR mode. Thus, the monitoring circuit 510 may count data of the page buffers PB1 to PBn.

During a second period T2 (e.g., a sensing data/transfer data period), the pass transistor TR24 included in all the page buffers PB1 to PBn may be turned off. Thus, the data transfer nodes DT included in each of the page buffers PB1 to PBn may be disconnected from each other, and data exchange between the latches LAT_S, LAT_L, and LAT_F in each of the page buffers PB1 to PBn may be performed. Next, during a third period T3 (e.g., a monitoring period), the pass transistors TR24 included in a portion (i.e., some) of the page buffers PBn-1 and PBn may be selectively turned on. Thus, only the data transfer nodes DT of a portion (or some) of the page buffers PBn-1 and PBn may be connected to the monitoring circuit 510 through the data transfer line 502.

As described above, in an embodiment of the inventive concepts, the monitoring circuit 510 may selectively turn on/off the pass transistors TR24 included in the page buffers PB1 to PBn, depending on an object (e.g., a page buffer) of which data is to be counted, thereby power to be consumed in the monitoring operation may be relatively reduced. When the monitoring circuit 510 determines an object of which data is to be counted, a pass transistor TR24 included in the object and a pass transistor(s) TR24 disposed between the object and the monitoring circuit 510 are be turned on.

FIGS. 10, 11, 12, 13, 14 and 15 illustrate respective diagrams of an operation of a page buffer 400 according to an embodiment of the inventive concepts.

Figure 10:
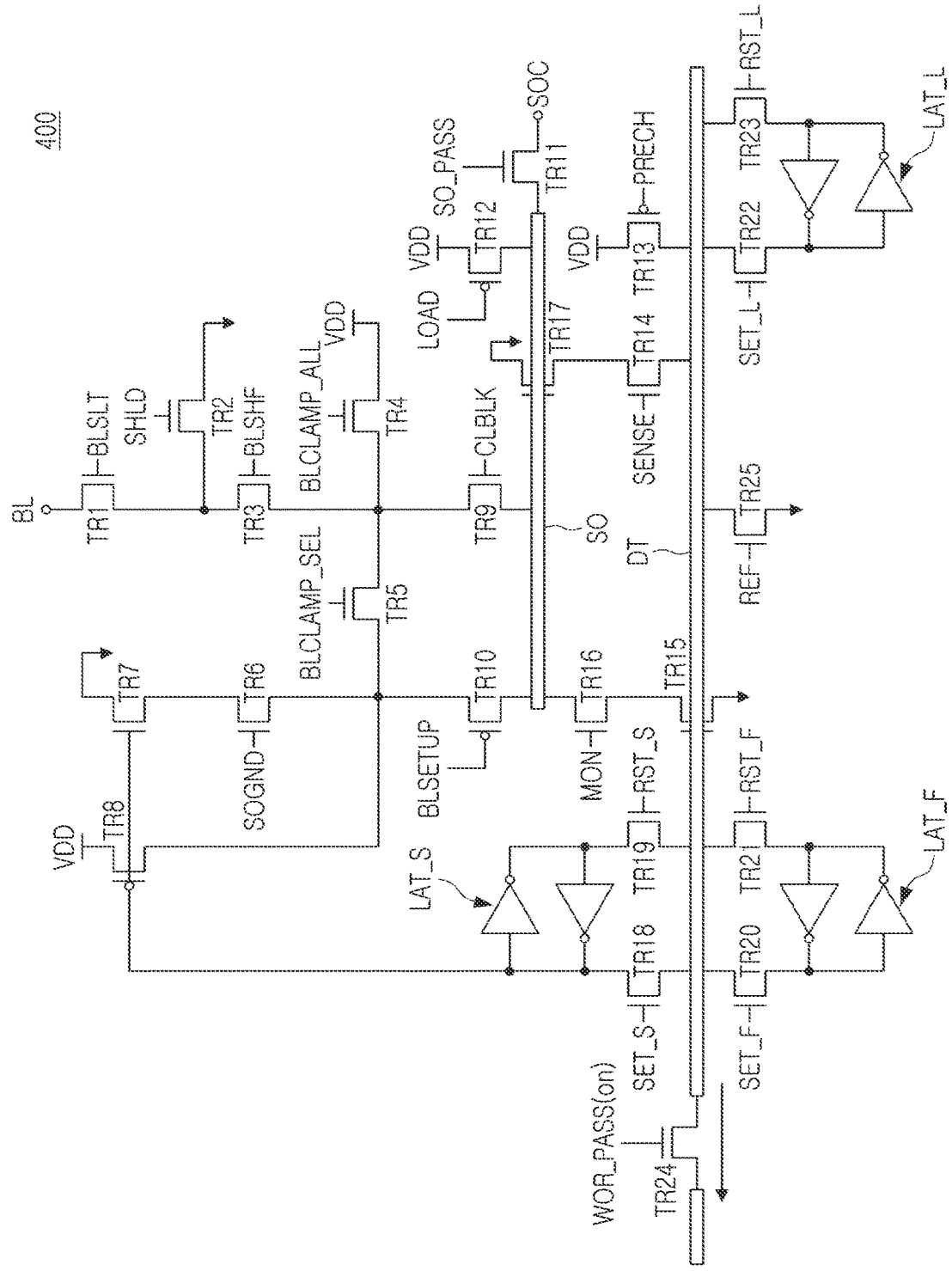
FIGS. 10, 11, 12, 13, 14 and 15 illustrate respective diagrams of an operation of a page buffer according to an embodiment of the inventive concepts.

An embodiment illustrated in FIG. 10 may correspond to a case in which a monitoring operation for counting data stored in at least one of latches LAT_S, LAT_L, and LAT_F is performed, in connection with a monitoring circuit (e.g., such as monitoring circuit 510 in FIG. 8). Referring to FIG. 10, according to (or responsive to) a pass control signal WOR_PASS, a pass transistor TR24 is turned on, and a data transfer node DT of the page buffer 400 is connected to a data transfer node DT of an other adjacent page buffer. The monitoring circuit may perform a monitoring operation by precharging the data transfer node DT to a predetermined power supply voltage VDD, and then developing the data transfer node DT with data of a latch in which data is to be counted.

As described previously, in an embodiment of the inventive concepts, the pass transistor TR24 included in the page buffer 400 may be turned off, depending on an object (e.g., data latch of a page buffer) to be monitored by the monitoring circuit. Therefore, a length of a line connecting the monitoring circuit and the data transfer node DT of the page buffer 400 to be monitored may be optimized, depending on an object to be monitored, and as a result, power consumption of the monitoring operation may be relatively reduced.

Embodiments illustrated in FIGS. 11 to 15 are diagrams for explaining an operation in which at least a portion (or some) of latches LAT_S, LAT_L, and LAT_F exchange data with each other in a state in which a pass transistor TR24 is turned off. Hereinafter, for convenience of explanation, it is assumed that data stored in an L latch LAT_L moves to an S latch LAT_S. It should be understood that the embodiments described with reference to FIGS. 11 to 15 may also be applied to other data transfer operations between latches LAT_S, LAT_L, and LAT_F.

Figure 11:
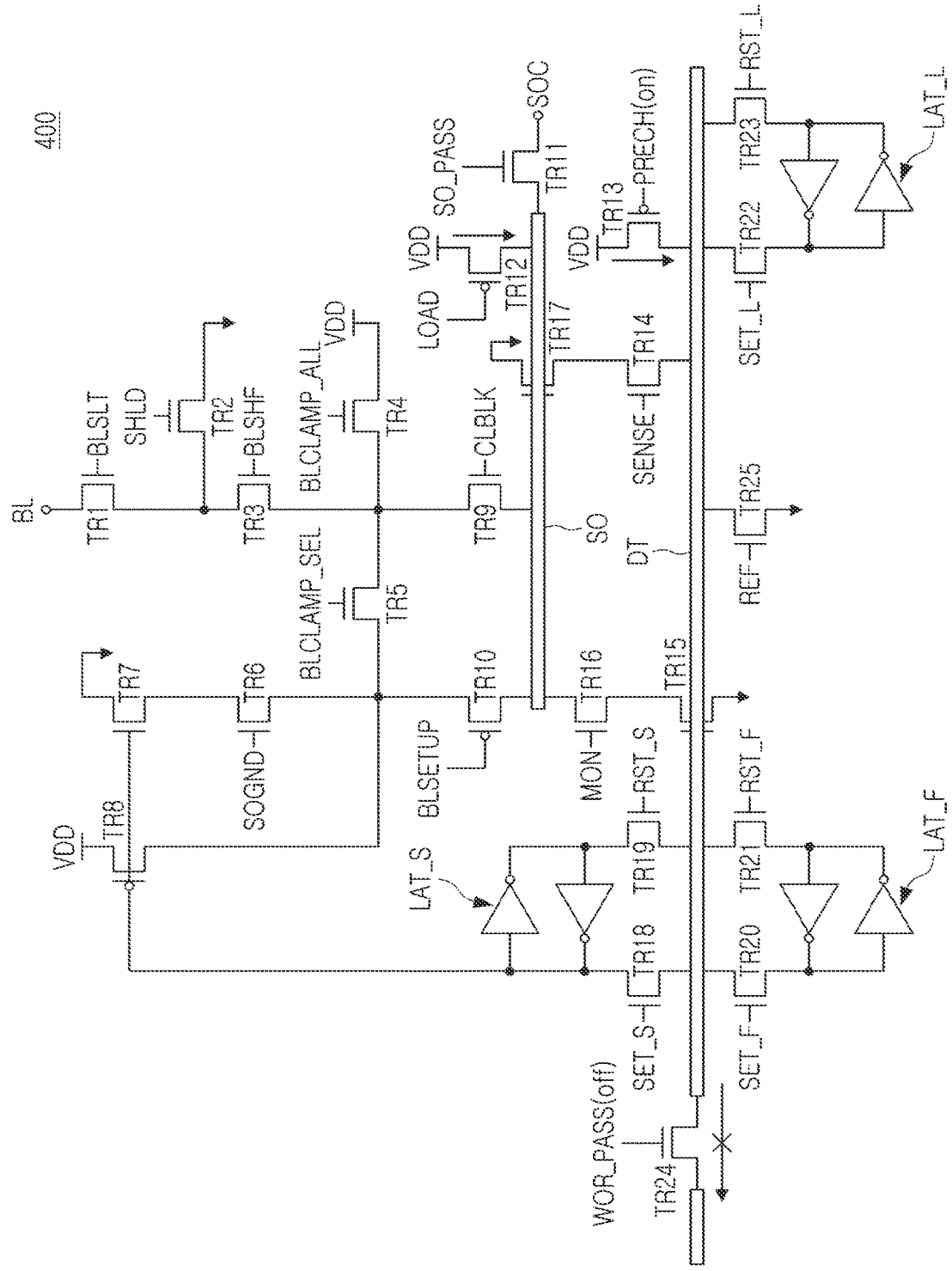

Referring to FIG. 11, a data transfer operation according to an embodiment may be performed in such a manner that a pass transistor TR24 is turned off and a thirteenth transistor TR13 is turned on to precharge a data transfer node DT. For example, the thirteenth transistor TR13 may be a PMOS transistor, and may be a first precharge element for precharging the data transfer node DT. When the thirteenth transistor TR13 is turned on, the data transfer node DT may be precharged to a first power supply voltage VDD. Meanwhile, a twelfth transistor TR12 may be turned on together with the thirteenth transistor TR13, such that a sensing node SO is precharged to the first power supply voltage VDD together with the data transfer node DT. The twelfth transistor TR12 may be a second precharge element for precharging the sensing node SO.

Figure 12:
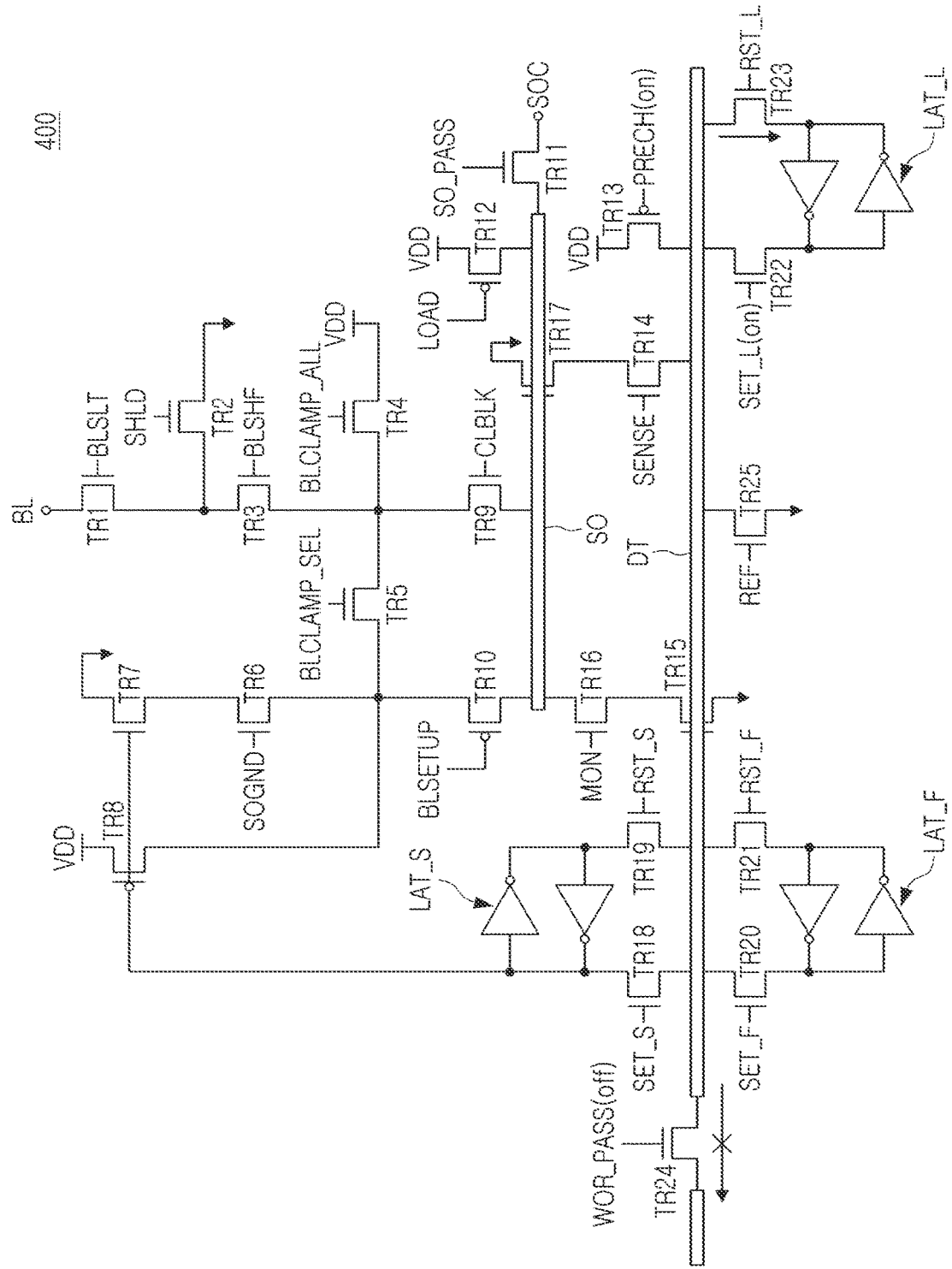

Next, referring to FIG. 12, a twenty-third transistor TR23 connected to an L latch LAT_L is turned on. As the twenty-third transistor TR23 is turned on, a voltage of a data transfer node DT may be developed with a voltage corresponding to data stored in the L latch LAT_L. For example, when a node connected to the twenty-third transistor TR23 stores a relatively high logic value, the voltage of the data transfer node DT may be relatively slowly reduced, or may be not substantially reduced. In contrast, when a node connected to the twenty-third transistor TR23 stores a relatively low logic value, the voltage of the data transfer node DT may be relatively quickly reduced.

When the voltage of the data transfer node DT is developed, on/off switching of a fifteenth transistor TR15 may be determined by the result of the development of the voltage of the data transfer node DT. For example, when the L latch LAT_L stores a relatively high logic value, the fifteenth transistor TR15 may be turned on. In contrast, when the L latch LAT_L stores a relatively low logic value, the voltage of the data transfer node DT may be relatively reduced, and the fifteenth transistor TR15 may be turned off.

Figure 13:
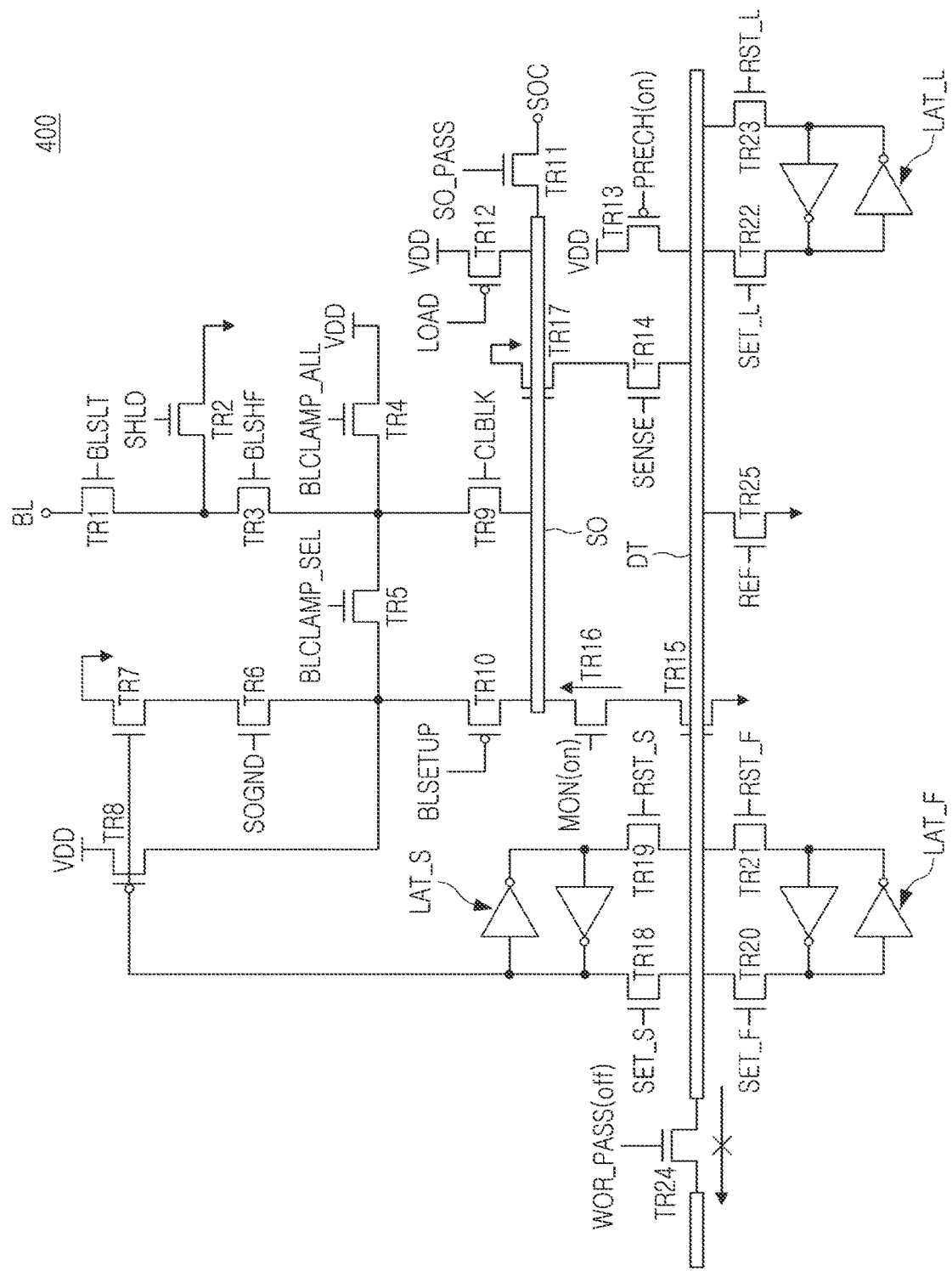

Next, referring to FIG. 13, a sixteenth transistor TR16 is turned on. For example, the sixteenth transistor TR16 may be turned on, while a twenty-third transistor TR23 is turned on. As described previously with reference to FIG. 12, when the L latch LAT_L stores a relatively high logic value, a fifteenth transistor TR15 may be turned on. As the sixteenth transistor TR16 is turned on, a voltage of the node SO may be relatively rapidly reduced. In contrast, when the L latch LAT_L stores a relatively low logic value, since a fifteenth transistor TR15 may be turned off, the voltage of the sensing node SO hardly changes (e.g., changes very little if at all), after the sixteenth transistor TR16 is turned on.

The result of the determination of the voltage of the sensing node SO may determine on/off of a seventeenth transistor TR17. For example, when the L latch LAT_L stores a relatively high logic value, the voltage of the sensing node SO may be relatively quickly reduced, and the seventeenth transistor TR17 may be turned off. In contrast, when the L latch LAT_L stores a relatively low logic value, since the voltage of the sensing node SO hardly changes, the seventeenth transistor TR17 may be turned on.

Figure 14:
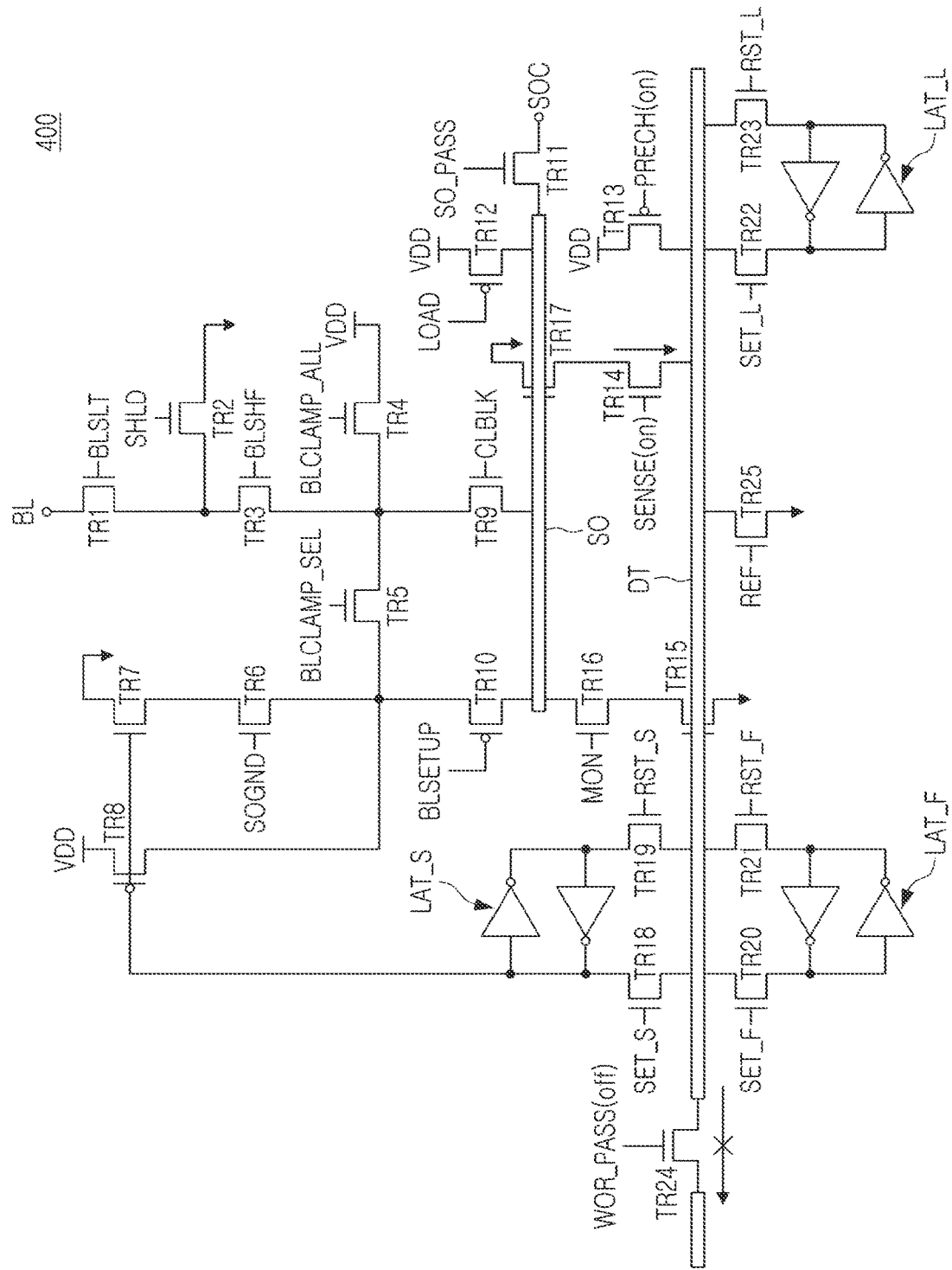
Figure 15:
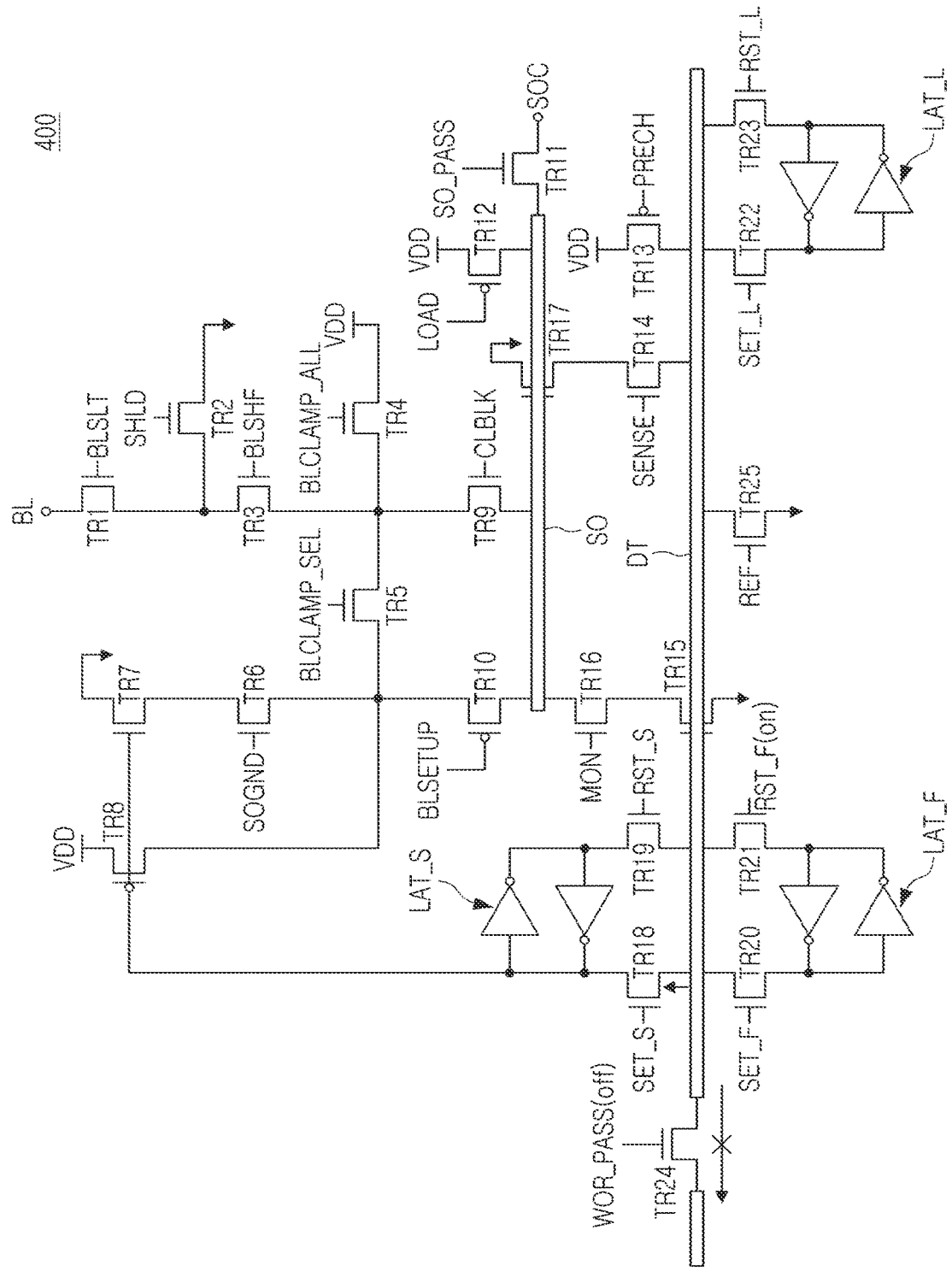

Next, referring to FIG. 14, a fourteenth transistor TR14 is turned on. When the L latch LAT_L stores a relatively high logic value, since the seventeenth transistor TR17 is turned off, before the fourteenth transistor TR14 is turned on, the voltage of the data transfer node DT may not change greatly. Therefore, the voltage of the data transfer node DT may have a value substantially equal to the precharged first power supply voltage VDD. Therefore, as illustrated in FIG. 15, the S latch LAT_S may store a relatively high logic value, as an eighteenth transistor TR18, which may be a set transistor of the S latch LAT_S, is turned on. When the eighteenth transistor TR18 is turned on, a relatively high logic value may be stored in the S latch LAT_S, such that the voltage of the data transfer node DT may be relatively reduced.

Referring again to FIG. 14, when the L latch LAT_L stores a relatively low logic value, a seventeenth transistor TR17 may be turned on, before a fourteenth transistor TR14 is turned on, such that the data transfer node DT may be connected to the second power supply voltage GND. Therefore, the voltage of the data transfer node DT may be reduced to the second power supply voltage GND. As illustrated in FIG. 15, when the eighteenth transistor TR18, which may be a set transistor of the S latch LAT_F, is turned on, the F latch LAT_F may store a relatively low logic value.

Figure 16:
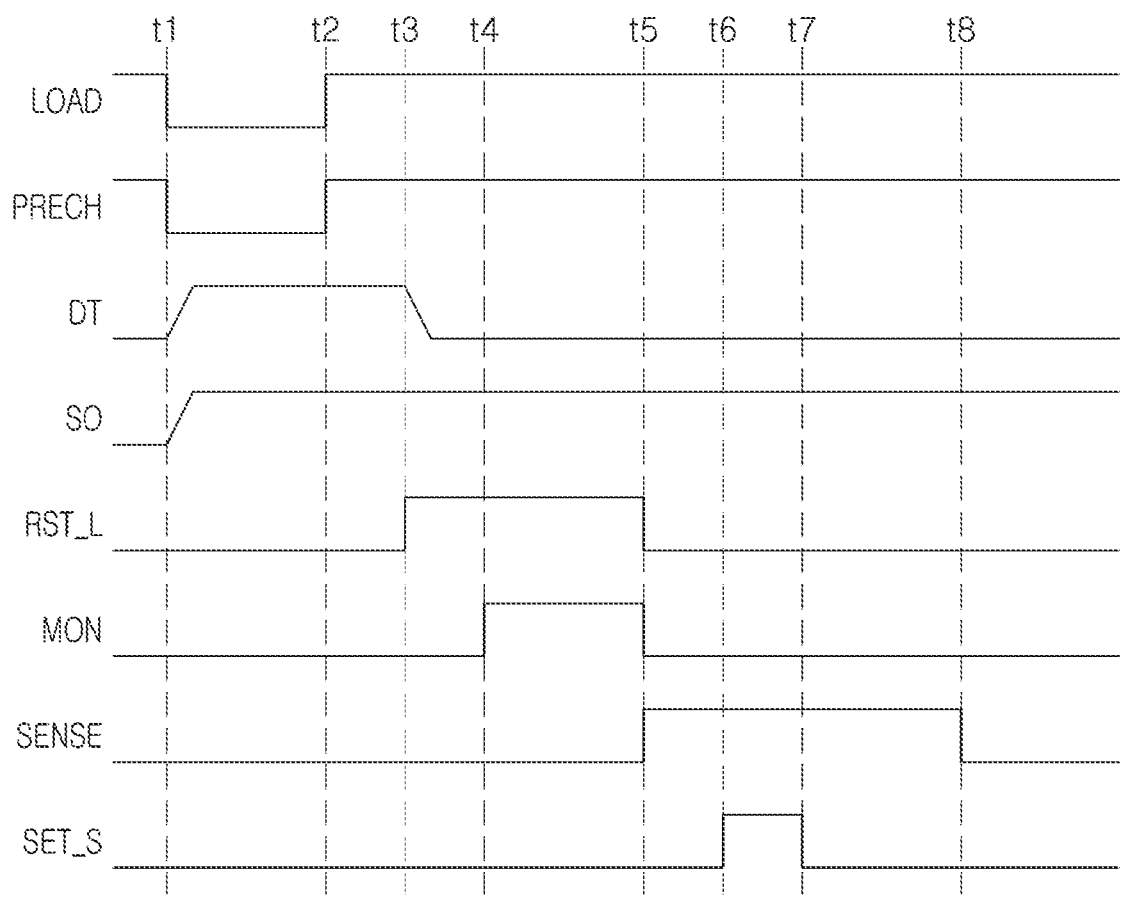
FIG. 16 illustrates a timing diagram of an operation of a page buffer according to an embodiment of the inventive concepts.
Figure 17:
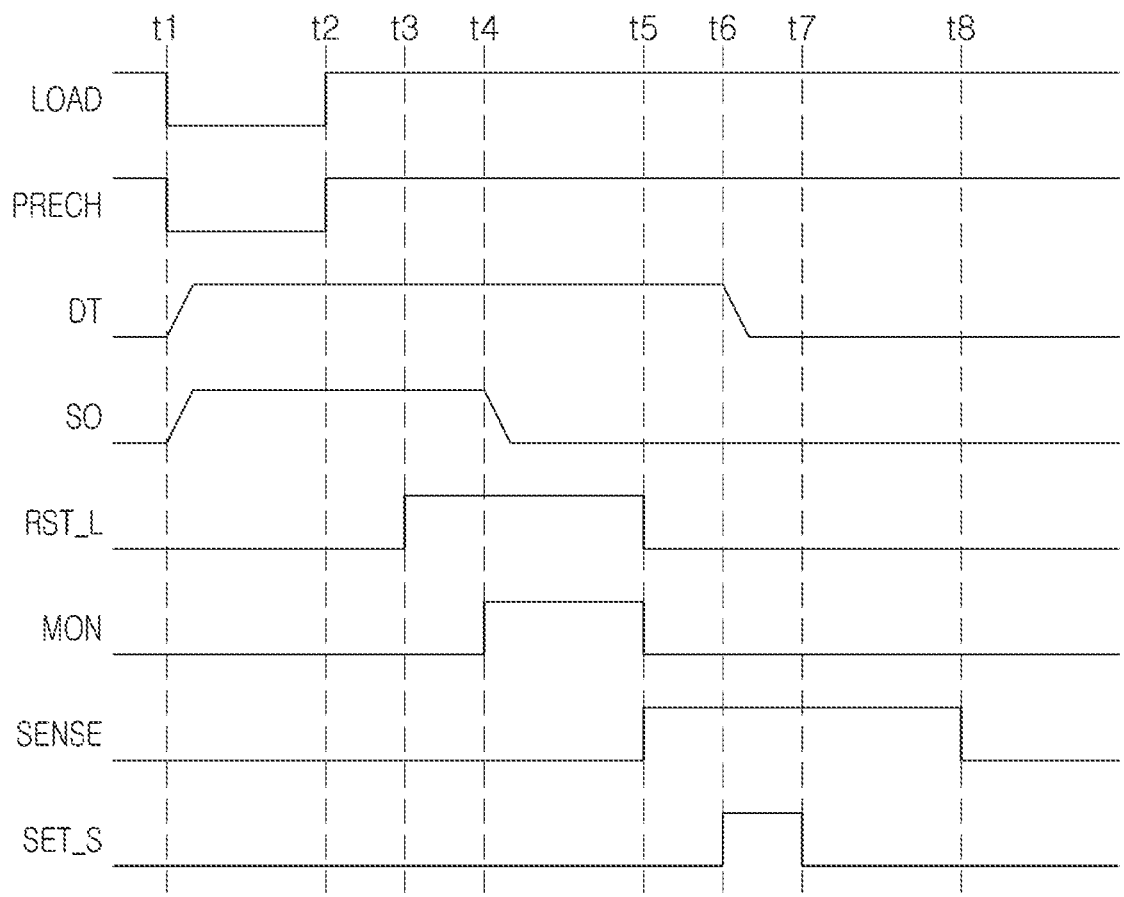
FIG. 17 illustrates a timing diagram of another operation of a page buffer according to an embodiment of the inventive concepts.

FIG. 16 illustrates a timing diagram of an operation of a page buffer according to an embodiment of the inventive concepts. FIG. 17 illustrates a timing diagram of another operation of a page buffer according to an embodiment of the inventive concepts.

For example, FIGS. 16 and 17 may be timing diagrams for explaining an operation of transferring data stored in an L latch LAT_L to an S latch LAT_S. Hereinafter, an operation of a page buffer 400 will be described with reference to FIGS. 11 to 15 for convenience of explanation.

Referring to FIG. 16, a twelfth transistor TR12 and a thirteenth transistor TR13 are turned on at a first time point t1, and a sensing node SO and a data transfer node DT may be precharged, respectively. For example, the sensing node SO and the data transfer node DT may be precharged to a first power supply voltage VDD. When a second time point t2 is reached, a twelfth transistor TR12 and a thirteenth transistor TR13 are turned off. When a predetermined delay time elapses from the second time point t2 and thereafter a third time point t3 is reached, a twenty-third transistor TR23 connected to the L latch LAT_L is turned on.

An embodiment illustrated in and hereinafter further described with reference to FIG. 16 is an embodiment wherein data '0' is stored in the node of the L latch LAT_L connected to the twenty-third transistor TR23. Therefore, when the twenty-third transistor TR23 is turned on, the voltage of the data transfer node DT may be relatively reduced. For example, the voltage of the data transfer node DT may be reduced to the second power supply voltage GND.

When the fourth time point t4 is reached, the sixteenth transistor TR16 is turned on while the twenty-third transistor TR23 is turned on. The voltage of the data transfer node DT may be reduced to the second power supply voltage GND, and the fifteenth transistor TR15 is thus turned off, such that the sensing node SO may maintain the first power supply voltage VDD, even after the sixteenth transistor TR16 is turned on. When the fifth time point t5 is reached, the sixteenth transistor TR16 and the twenty-third transistor TR23 are turned off, and the fourteenth transistor TR14 is turned on.

Since the sensing node SO maintains the first power supply voltage VDD even after the fourth time point t4, the seventeenth transistor TR17 is continuously turned on. Therefore, when the fourteenth transistor TR14 is turned on at the fifth time point t5, the data transfer node DT may be connected to the second power supply voltage GND through the fourteenth transistor TR14 and the seventeenth transistor TR17. When the eighteenth transistor TR18 connected to the S latch LAT_S is turned on at the sixth time point t6, data '0' is stored in the node of the S latch LAT_S connected to the eighteenth transistor TR18, by the data transfer node DT reduced to the second power supply voltage GND.

Next, an embodiment illustrated in and hereinafter described with reference to FIG. 17 is an embodiment wherein data '1' is stored in the node of the L latch LAT_L connected to the twenty-third transistor TR23. Referring to FIG. 17, the sensing node SO and the data transfer node DT may be precharged by the twelfth transistor TR12 and the thirteenth transistor TR13, turned on between the first time point t1 and the second time point t2. Thereafter, when a predetermined delay time elapses and the third time point t3 is reached, the twenty-third transistor TR23 is turned on. In contrast to the embodiment illustrated in FIG. 16, since data '1' is stored in the node of the L latch LAT_L connected to the twenty-third transistor TR23, the voltage of the data transfer node DT may be not substantially reduced. For example, the voltage of the data transfer node DT may be maintained at the first power supply voltage VDD, even after the twenty-third transistor TR23 is turned on, and the fifteenth transistor TR15 may be maintained in a turn-on state.

When the sixteenth transistor TR16 is turned on at the fourth time point t4, the sensing node SO may be connected to the second power supply voltage GND by the fifteenth transistor TR15 and the sixteenth transistor TR16. Therefore, as illustrated in FIG. 17, the voltage of the sensing node SO is relatively reduced after the fourth time point t4, and the seventeenth transistor TR17 is turned off. Therefore, even when the fourteenth transistor TR14 is turned on at the fifth time point t5, the data transfer node DT is not connected to the second power supply voltage GND, and the voltage of the data transfer node DT may be maintained at the first power supply voltage VDD.

When the eighteenth transistor TR18 connected to the S latch LAT_L is turned on at the sixth time point t6, data corresponding to the voltage of the data transfer node DT may be stored in the S latch LAT_S. Accordingly, data '1' stored in the L latch LAT_L may be stored in the S latch LAT_S. As data '1' is stored in the S latch LAT_S by the voltage of the data transfer node DT held at the first power supply voltage VDD, the voltage of the data transfer node DT may be relatively reduced.

For example, in embodiments of the inventive concepts, a set transistor and a reset transistor of each of the latches LAT_S, LAT_L, and LAT_F may be connected to the data transfer node DT and the sensing node SO by the fourteenth to seventeenth transistors TR14 to TR17. Therefore, the number of transistors TR1 to TR25 may be relatively reduced, and the page buffer may be efficiently implemented in a limited area, as compared with a conventional page buffers in which transistors for connecting each of the latches LAT_S, LAT_L, and LAT_F to the sensing node SO are separately provided.

Also, in embodiments of the inventive concepts, lines used only for the wired OR connection between the conventional page buffers and the monitoring circuit may be removed, and a line for the wired OR connection may be also utilized as the data transfer node between the latches in the page buffer. Therefore, the degree of design freedom of layout of the page buffer in which the number and arrangement of lines are limited, may be improved, and, at the same time, the power consumption of the memory device may be optimized by controlling the length of the line for the wired OR connection, depending on an object to be monitored. Also, the sensing node may simultaneously perform the development and data transmission operations, by separating the sensing node and the data transfer node.

Figure 18:
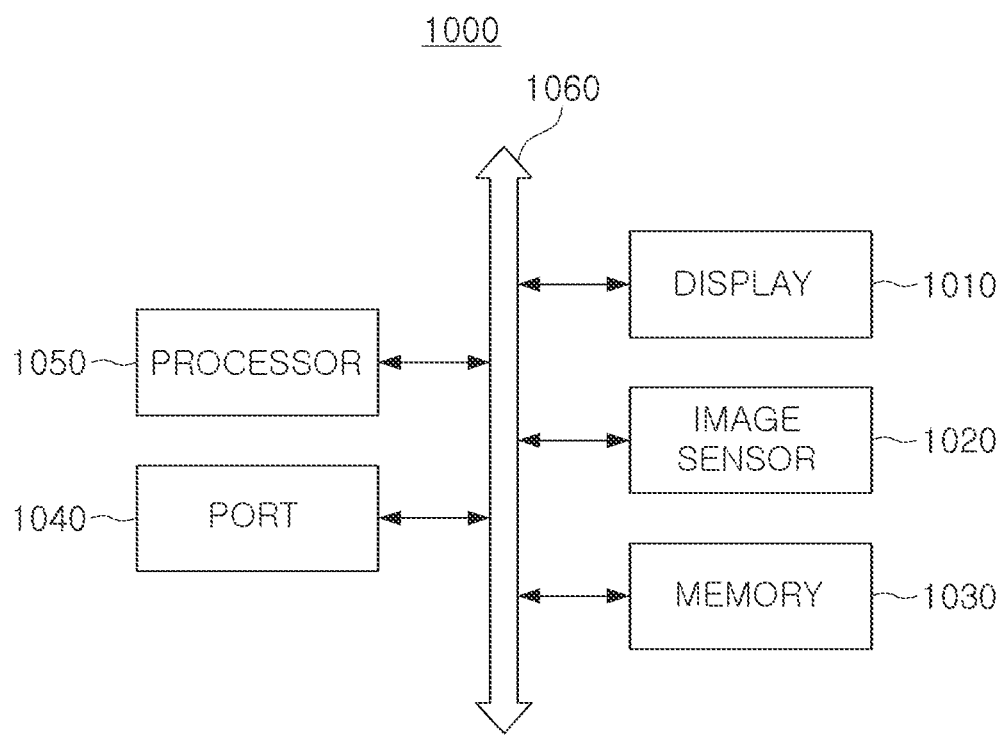
FIG. 18 illustrates a block diagram of an electronic device including a memory device according to an embodiment of the inventive concepts.

FIG. 18 illustrates a block diagram of an electronic device including a memory device according to an embodiment of the present inventive concept.

An electronic device 1000 according to an embodiment illustrated in FIG. 18 includes a display 1010, an image sensor 1020, a memory 1030, a port 1040, and a processor 1050. The electronic device 1000 may include other components or devices. For example, in addition the electronic device 1000 may further include a wired/wireless communication device and a power supply device, among other devices or components. Among components illustrated in FIG. 18, the port 1040 may be a device in which the electronic device 1000 is provided for communicating with for example a video card, a sound card, a memory card, a USB device, and the like. The electronic device 1000 may be a comprehensive concept including for example a conventional desktop computer, a laptop computer, a smartphone, a tablet PC, a smart wearable device, and the like.

The processor 1050 may perform specific operations, commands, tasks, and the like. The processor 1050 may be for example a central processing unit (CPU) or a microprocessor unit (MCU), and may communicate with other devices connected to the port 1040 in addition to communicating with the display 1010, the image sensor 1020, and the memory device 1030.

The memory 1030 may be a storage medium for storing data necessary for an operation of the electronic device 1000, or for example multimedia data. The memory 1030 may be a volatile memory such as a random access memory (RAM), or a non-volatile memory such as a flash memory. The memory 1030 may also include for example at least one of a solid state drive (SSD), a hard disk drive (HDD), and an optical drive (ODD) as a storage device. The memory 1030 may include any one of the memory devices according to various embodiments described above with reference to FIGS. 1 to 17.

Figure 19:
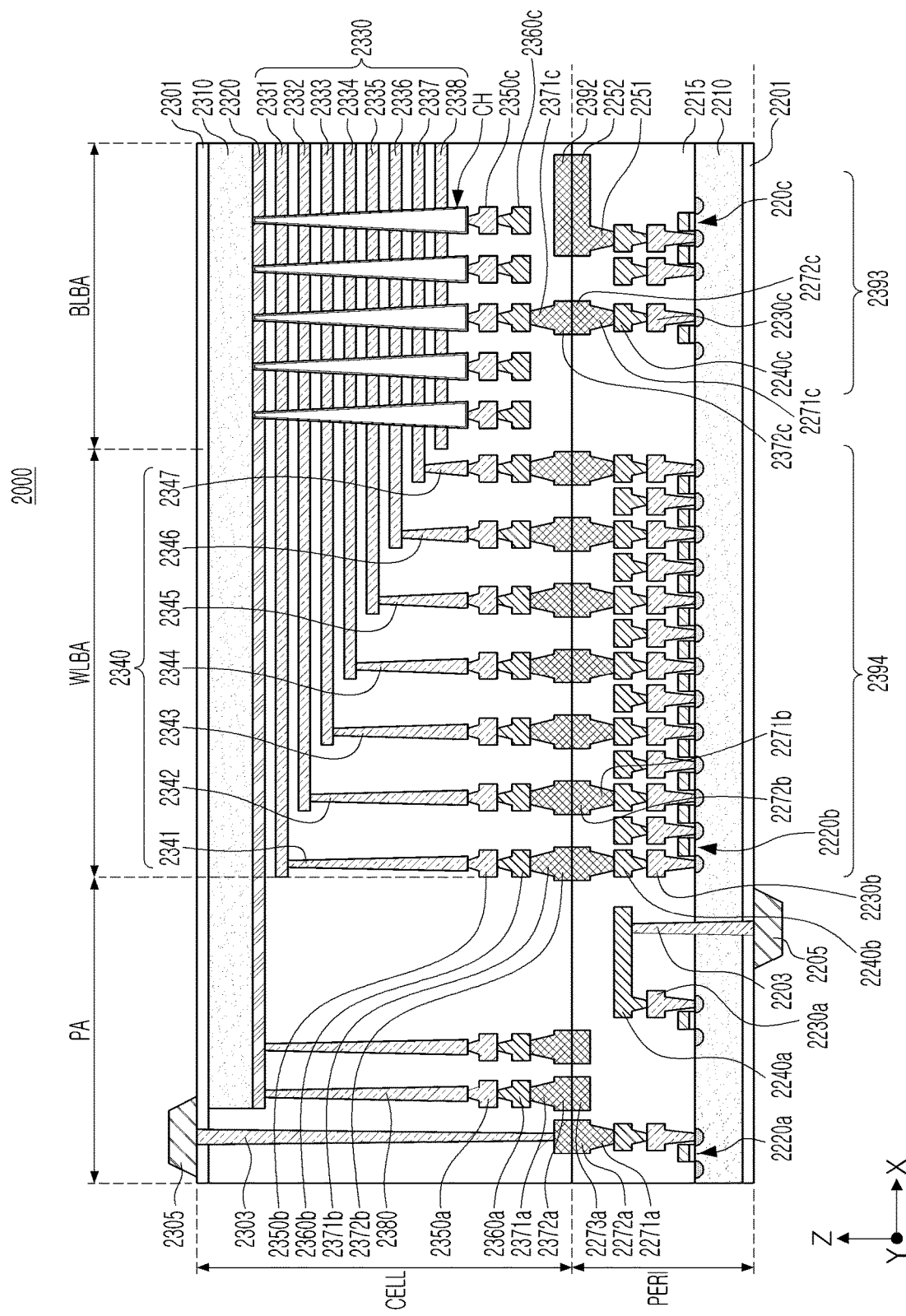
FIG. 19 illustrates a memory device according to an embodiment of the inventive concepts.

Referring to FIG. 19, a memory device 2000 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 2000 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high resistance, and the second metal layers 2240a, 2240b, and 2240c may be formed of copper having relatively low resistance.

In an example embodiment illustrate in FIG. 19, although the first metal layers 2230a, 2230b, and 2230c and the second metal layers 2240a, 2240b, and 2240c are shown and described, they are not limited thereto, and one or more metal layers may be further formed on the second metal layers 2240a, 2240b, and 2240c. At least a portion of the one or more metal layers formed on the second metal layers 2240a, 2240b, and 2240c may be formed of aluminum or the like having a lower resistance than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b in the peripheral circuit region PERI may be electrically connected to upper bonding metals 2371b and 2372b in the cell region CELL in a bonding manner, and the lower bonding metals 2271b and 2272b and the upper bonding metals 2371b and 2372b may be formed of aluminum, copper, tungsten, or the like.

The cell region CELL may include at least one memory block. The cell region CELL may include a second substrate 2310 and a common source line 2320. On the second substrate 2310, a plurality of word lines 2331 to 2338 (i.e., 2330) may be stacked in a direction (a Z-axis direction), perpendicular to an upper surface of the second substrate 2310. At least one string select line and at least one ground select line may be arranged on and below the plurality of word lines 2330, respectively, and the plurality of word lines 2330 may be disposed between the at least one string select line and the at least one ground select line.

In the bit line bonding area BLBA, a channel structure CH may extend in a direction, perpendicular to the upper surface of the second substrate 2310, and pass through the plurality of word lines 2330, the at least one string select line, and the at least one ground select line. The channel structure CH may include a data storage layer, a channel layer, a buried insulating layer, and the like, and the channel layer may be electrically connected to a first metal layer 2350c and a second metal layer 2360c. For example, the first metal layer

2350c may be a bit line contact, and the second metal layer 2360c may be a bit line. In an example embodiment, the bit line 2360c may extend in a first direction (a Y-axis direction), parallel to the upper surface of the second substrate 2310.

In an example embodiment illustrated in FIG. 19, an area in which the channel structure CH, the bit line 2360c, and the like are disposed may be defined as the bit line bonding area BLBA. In the bit line bonding area BLBA, the bit line 2360c may be electrically connected to the circuit elements 2220c providing a page buffer 2393 in the peripheral circuit region PERI. For example, the bit line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word line bonding area WLBA, the plurality of word lines 2330 may extend in a second direction (an X-axis direction), parallel to the upper surface of the second substrate 2310, and may be connected to a plurality of cell contact plugs 2341 to 2347 (i.e., 2340). The plurality of word lines 2330 and the plurality of cell contact plugs 2340 may be connected to each other in pads provided by at least a portion of the plurality of word lines 2330 extending in different lengths in the second direction. A first metal layer 2350b and a second metal layer 2360b may be connected to an upper portion of the plurality of cell contact plugs 2340 connected to the plurality of word lines 2330, sequentially. The plurality of cell contact plugs 2340 may be connected to the circuit region PERI by the upper bonding metals 2371b and 2372b of the cell region CELL and the lower bonding metals 2271b and 2272b of the peripheral circuit region PERI in the word line bonding area WLBA.

The plurality of cell contact plugs 2340 may be electrically connected to the circuit elements 2220b providing a row decoder 2394 in the peripheral circuit region PERI. In an example embodiment, operating voltages of the circuit elements 2220b providing the row decoder 2394 may be different than operating voltages of the circuit elements 2220c providing the page buffer 2393. For example, operating voltages of the circuit elements 2220c providing the page buffer 2393 may be greater than operating voltages of the circuit elements 2220b providing the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input-output pads 2205 and 2305 may be disposed in the external pad bonding area PA. Referring to FIG. 19, a lower insulating film 2201 covering a lower surface of the first substrate 2210 may be formed below the first substrate 2210, and a first input-output pad 2205 may be formed on the lower insulating film 2201. The first input-output pad 2205 may be connected to at least one of the plurality of circuit elements 2220a, 2220b, and 2220c disposed in the peripheral circuit region PERI through a first input-output contact plug 2203, and may be separated from the first substrate 2210 by the lower insulating film 2201. In addition, a side insulating film may be disposed between the first input-output contact plug 2203 and the first substrate 2210 to electrically separate the first input-output contact plug 2203 and the first substrate 2210.

Referring to FIG. 19, an upper insulating film 2301 covering the upper surface of the second substrate 2310 may be formed on the second substrate 2310, and a second input-output pad 2305 may be disposed on the upper insulating layer 2301. The second input-output pad 2305 may be connected to at least one of the plurality of circuit elements 2220a, 2220b, and 2220c disposed in the peripheral circuit region PERI through a second input-output contact plug 2303.

According to embodiments, the second substrate 2310 and the common source line 2320 may not be disposed in an area in which the second input-output contact plug 2303 is disposed. Also, the second input-output pad 2305 may not overlap the word lines 2330 in the third direction (the Z-axis direction). Referring to FIG. 19, the second input-output contact plug 2303 may be separated from the second substrate 2310 in a direction, parallel to the upper surface of the second substrate 2310, and may pass through the interlayer insulating layer 2315 of the cell region CELL to be connected to the second input-output pad 2305.

According to embodiments, the first input-output pad 2205 and the second input-output pad 2305 may be selectively formed. For example, the memory device 2000 may include only the first input-output pad 2205 disposed on the first substrate 2210 or the second input-output pad 2305 disposed on the second substrate 2310. Alternatively, the memory device 2000 may include both the first input-output pad 2205 and the second input-output pad 2305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same shape as the upper metal pattern 2372a of the cell region CELL, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to the upper bonding metals 2371b and 2372b of the cell region CELL by a Cu—Cu bonding.

Further, the bit line bonding area BLBA, an upper metal pattern 2392, corresponding to a lower metal pattern 2252 formed in the uppermost metal layer of the peripheral circuit region PERI, and having the same shape as the lower metal pattern 2252 of the peripheral circuit region PERI, may be formed in an uppermost metal layer of the cell region CELL.

A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

According to embodiments of the inventive concepts, a circuit and layout of a page buffer may be designed such that a line conventionally connected to a monitoring circuit is utilized as a data transfer node, and a sensing line connected to a sensing node may be disposed between the latch signal lines of complementary characteristics. Accordingly, the degree of design freedom of a circuit and layout according to the arrangement of the conductive lines may be relatively increased, and the sensing node may be effectively protected from an electromagnetic noise. In addition, the power consumption of the memory device may be relatively reduced by reading data from only a portion (or some) of the page buffers during the monitoring operation, and the operation efficiency of the memory device may be relatively improved by developing the sensing node while the latches in the page buffer transfer data.

The various and advantageous advantages and effects of the inventive concepts are not limited to the above description, and may be more easily understood in the course of describing a specific embodiment of the inventive concepts.

While example embodiments have been shown and described above, it should be apparent to those skilled in the art that modifications and variations could be made without departing from the scope of the present inventive concept as defined by the appended claims.

What is claimed is:

1. A memory device comprising:
a memory cell array including a plurality of memory blocks having a plurality of memory cell strings, and a plurality of bit lines connected to at least one of the plurality of memory cell strings;
a plurality of page buffers connected to the plurality of bit lines, and arranged in a first direction and in a second direction, orthogonal to the first direction, wherein each of the plurality of page buffers comprises
a plurality of transistors including a pass transistor,
a sensing line connected to at least one transistor other than the pass transistor, among the plurality of transistors, and
a data transfer line connected to at least another transistor other than the at least one transistor connected to the sensing line; and
a monitoring circuit connected to at least one page buffer among the plurality of page buffer,
wherein the pass transistor included in the at least one page buffer connected to the monitoring circuit is connected between the data transfer line and the monitoring circuit, and each of the other pass transistors are connected between the data transfer line of a page buffer including the each of the other pass transistors and the data transfer line of another page buffer.

2. The memory device of claim 1, wherein the plurality of page buffers arranged in the first direction correspond to the plurality of bit lines included in the same memory block, and the plurality of page buffers arranged in the second direction correspond to the plurality of bit lines included in different memory block.

3. The memory device of claim 1, wherein the at least one page buffer connected to the monitoring circuit is disposed farthest from the memory cell array in the first direction among the plurality of page buffers.

4. The memory device of claim 1, wherein the plurality of the transistors included in the each of the plurality of page buffers are arranged in the first direction.

5. The memory device of claim 4, wherein the pass transistor is disposed farthest from the memory cell array among the plurality of the transistors in each of the plurality of page buffers.

6. The memory device of claim 1, wherein each of the plurality of page buffers further comprises at least one of power lines for supplying a power voltage, lines for transferring a latch signal, and lines for connecting to a cache latch circuit.

7. The memory device of claim 1, wherein the data transfer line is electrically connected to a plurality of latch circuits through at least one of the plurality of transistors, and the sensing line is connected to the data transfer line through at least another one of the plurality of transistors.

8. The memory device of claim 1, wherein the sensing line is connected to a gate electrode of the at least one transistor, and the data transfer line is connected to an active region of the at least another transistor.

9. A memory device comprising:
a memory cell array having a plurality of memory cell strings, and a plurality of first to n-th bit lines connected to at least one of the plurality of memory cell strings;
a plurality of first to n-th page buffers connected to the plurality of first to n-th bit lines, sequentially arranged in a first direction, and performing a transferring operation to transfer data between a plurality of latch circuits using first signals applied to a conductive line connected or separated from each other by a pass transistor; and
a monitoring circuit connected to the n-th page buffer, and performing a monitoring operation to monitor data stored in at least some of the plurality of first to n-th page buffers using second signals applied to the same conductive line.

10. The memory device of claim 9, wherein a length of the conductive line is changed according to whether the pass transistor is turned on or off in the monitoring operation.

11. The memory device of claim 10, wherein whether to turn the pass transistor on or off is determined by a pass control signal applied to a gate electrode of the pass transistor, and the pass control signal is determined by target page buffer to be monitored.

12. The memory device of claim 9, wherein the monitoring operation includes a first operation of counting data stored in each of the plurality of first to n-th page buffers, and a third operation of selectively monitoring data stored in any one of the plurality of first to n-th page buffers, and
wherein the transferring operation is defined as a second operation.

13. The memory device of claim 12, wherein the pass transistor included in each of the plurality of first to n-th page buffers is turned on while performing the first operation.

14. The memory device of claim 12, wherein the pass transistor included in each of the plurality of first to n-th page buffers is turned off while performing the second operation.

15. The memory device of claim 12, wherein only a pass transistor included in the n-th page buffer is turned on while performing the third operation.

16. The memory device of claim 12, wherein a length of the conductive line to which the second signal is applied while performing the first operation is a first length, and the length of the conductive line to which the second signal is applied while performing the third operation is a second length less than the first length.

17. The memory device of claim 12, wherein the first operation, the second operation, and the third operation are performed sequentially.

18. The memory device of claim 9, wherein the monitoring circuit precharges the conductive line to a predetermined voltage when at least one of the pass transistors is turned on, and develops the precharged voltage of the conductive line by data stored in the plurality of the latch circuits.

19. A memory device comprising:
- a memory cell region including a first metal pad;
- a peripheral circuit region including a second metal pad and vertically connected to the memory cell region by the first metal pad and the second metal pad;
- a memory cell array in the memory cell region including a plurality of memory blocks having a plurality of memory cell strings, and a plurality of bit lines connected to the plurality of memory cell strings;
- a plurality of page buffers in the peripheral circuit region connected to the plurality of bit lines, and arranged in a first direction and in a second direction, orthogonal to the first direction, wherein each of the plurality of page buffers comprises
  - a plurality of transistors including a pass transistor configured to set a connection with another page buffer,
  - a sensing line connected to at least one transistor other than the pass transistor, among the plurality of transistors, and
  - a data transfer line connected to at least another transistor other than the at least one transistor connected to the sensing line; and
- a monitoring circuit in the peripheral circuit region connected to at least one page buffer among the plurality of page buffer.

20. The memory device of claim 19, wherein each of the plurality of memory cell strings included in one memory block in the memory cell region correspond to each of the plurality of page buffers arranged in the first direction in the peripheral circuit region, and
wherein the plurality of transistors are arranged in the first direction in each of the plurality of page buffers.

* * * * *